(12) United States Patent
Grover et al.

(10) Patent No.: US 11,158,749 B2
(45) Date of Patent: Oct. 26, 2021

(54) DOPED PHOTOVOLTAIC SEMICONDUCTOR LAYERS AND METHODS OF MAKING

(71) Applicant: First Solar, Inc., Tempe, AZ (US)

(72) Inventors: Sachit Grover, Perrysburg, OH (US); Stuart Irvine, Perrysburg, OH (US); Xiaoping Li, Perrysburg, OH (US); Roger Malik, Perrysburg, OH (US); Shahram Seyedmohammadi, Perrysburg, OH (US); Gang Xiong, Perrysburg, OH (US); Wei Zhang, Perrysburg, OH (US)

(73) Assignee: First Solar, Inc., Tempe, AZ (US)

(*) Notice: Subject to any disclaimer, the term of this patent is extended or adjusted under 35 U.S.C. 154(b) by 166 days.

(21) Appl. No.: 16/488,275

(22) PCT Filed: Feb. 22, 2018

(86) PCT No.: PCT/US2018/019129
§ 371 (c)(1),
(2) Date: Aug. 23, 2019

(87) PCT Pub. No.: WO2018/156698
PCT Pub. Date: Aug. 30, 2018

(65) Prior Publication Data
US 2021/0143288 A1 May 13, 2021

Related U.S. Application Data

(60) Provisional application No. 62/463,579, filed on Feb. 24, 2017.

(51) Int. Cl.
H01L 31/18 (2006.01)
H01L 31/0296 (2006.01)

(52) U.S. Cl.
CPC .... *H01L 31/02963* (2013.01); *H01L 31/1828* (2013.01); *H01L 31/1864* (2013.01)

(58) Field of Classification Search
None
See application file for complete search history.

(56) References Cited

U.S. PATENT DOCUMENTS 4,566,918 A 1/1986 Irvine et al.
4,650,539 A 3/1987 Irvine et al.
(Continued)

FOREIGN PATENT DOCUMENTS

WO 9118129 A1 11/1991
WO 2007129097 A2 11/2007
WO 2016133973 A1 8/2016

OTHER PUBLICATIONS

Yu et al., "Hydrogenation of undoped and nitrogen-doped CdTe grown by molecular beam epitaxy", American Institute of Physics, (1996), vol. 68, No. 4, pp. 529-531.
(Continued)

*Primary Examiner* — Eli S Mekhlin
(74) *Attorney, Agent, or Firm* — MacMillan, Sobanski & Todd, LLC

(57) ABSTRACT

Provided are structures and methods for doping polycrystalline thin film semiconductor materials in photovoltaic devices. Embodiments include methods for forming and treating a photovoltaic semiconductor absorber layer.

14 Claims, 12 Drawing Sheets

(56) References Cited

U.S. PATENT DOCUMENTS

| | | | |
|---|---|---|---|
| 4,719,124 | A | 1/1988 | Lu et al. |
| 4,759,951 | A * | 7/1988 | Itoh .................... H01L 31/09 |
| | | | 136/260 |
| 4,904,337 | A | 2/1990 | Elliot et al. |
| 5,202,283 | A | 4/1993 | Younger et al. |
| 5,302,232 | A | 4/1994 | Ebe et al. |
| 5,306,660 | A | 4/1994 | Younger et al. |
| 5,882,805 | A | 3/1999 | Higa et al. |
| 5,976,958 | A | 11/1999 | Rajavel et al. |
| 7,355,185 | B2 | 4/2008 | Yasuda et al. |
| 8,748,214 | B2 | 6/2014 | DeLuca et al. |
| 8,912,037 | B2 | 12/2014 | Johnson et al. |
| 9,147,792 | B2 | 9/2015 | Christensen et al. |
| 9,263,608 | B2 | 2/2016 | Powell et al. |
| 9,318,642 | B2 | 4/2016 | Gupta et al. |
| 9,373,744 | B2 | 6/2016 | Foust |
| 9,496,446 | B2 | 11/2016 | Cao et al. |
| 10,026,855 | B2 | 7/2018 | Govindarajan et al. |
| 10,861,994 | B2 | 12/2020 | Abken et al. |
| 2012/0042950 | A1 | 2/2012 | Chin |
| 2013/0230945 | A1 | 9/2013 | Shao et al. |
| 2013/0327398 | A1 | 12/2013 | Dhere et al. |
| 2014/0134786 | A1 * | 5/2014 | Gessert ............... H01L 21/0262 |
| | | | 438/95 |
| 2014/0134838 | A1 | 5/2014 | Gossman et al. |
| 2014/0261685 | A1 | 9/2014 | Liao et al. |
| 2015/0221810 | A1 | 8/2015 | Albin et al. |
| 2015/0221812 | A1 | 8/2015 | Reese et al. |

OTHER PUBLICATIONS

Yu et al., "Photon Assisted Growth of Nitrogen-Doped CdTe and the Effects of Hydrogen Incorporation During Growth", Journal of Electronic Materials, (1996), vol. 25, No. 8, pp. 1247-1253.

International Search Report and Written Opinion, Application No. PCT/US2018/019129 filed Feb. 22, 2018, dated May 24, 2018.

Bosio et al. "Polycrystalline CdTe thin films for photovoltaic applications," ScienceDirect, 2006, pp. 247-279, vol. 52.

Vigil-Galán et al. "CdTe:Bi films deposited by closed space vapor transport under variable pressure and doping levels: Evidences of the possible formation of an intermediate band," Journal of Materials Science Materials in Electronics, 2016, pp. 1-9.

Colegrove et al. "Phosphorus doping of polycrystalline CdTe by diffusion," 2015, pp. 1-6.

Zhang et al. "Preparation and thermoelectric properties of p-type Bi0.52Sb1.48Te3 + 3% Te thin films," Chinese Science Bulletin, 2012, pp. 4220-4224, vol. 57, No. 32.

Vigil-Galán et al. "Passivation properties of nitric/phosphoric etching on CdTe films: Influence of the etching time and nitric acid concentration," Thin Solid Films, 2011, pp. 7164-7167, vol. 519.

Vigil-Galán et al. "Comparative study of the p+ layer created in CdTe films by nitric—phosphoric etching and chemical-deposition methods," Journal of Physics and Chemistry of Solids, 2009, pp. 404-406, vol. 71.

Lee et al. "Influence of Annealing Temperature and Atmosphere on the Properties of ITO Films Deposited Using a Powdery Target," Journal of Korean Physical Society, 2007, pp. 1143-1146, vol. 51, No. 3.

Mochizuki et al. Abstract of "Growth of CdTe thin films by direct reaction of Cd and Te vapors under hydrogen flow," Journal of Crystal Growth, 1984, vol. 67, Issue 3, pp. 420-424.

Britt, J.S., Abstract of Dissertation "II-VI compound thin films by MOCVD for tandem solar cells," University of South Florida, 1992.

Park et al. Abstract of "Incorporation and Activation of Arsenic Dopant in Single-Crystal CdTe Grown on Si by Molecular Beam Epitaxy," Journal of Electronic Materials, 2014, vol. 43, pp. 2998-3003.

Irvine et al. Abstract of "New mechanisms in photo-assisted MOVPE of II-VI semiconductors," Journal of Electronic Materials, 1997, vol. 26, p. 723-727.

European Communication Pursuant to Article 94(3) EPC, Application No. 18709856.1, dated Aug. 10, 2020, p. 1-9.

* cited by examiner

DOPED PHOTOVOLTAIC SEMICONDUCTOR LAYERS AND METHODS OF MAKING

CROSS-REFERENCE TO RELATED APPLICATIONS

This is a national phase application of international application PCT/US2018/019129, filed under the authority of the Patent Cooperation Treaty on Feb. 22, 2018, published Aug. 30, 2018; which claims the benefit of U.S. Provisional Application No. 62/463,579, filed under 35 U.S.C. § 111(b) on Feb. 24, 2017.

BACKGROUND

A photovoltaic device generates electrical power by converting light into direct current electricity using semiconductor materials that exhibit the photovoltaic effect. Photovoltaic devices produce current when light absorption excites charge carriers, electrons or holes, to a higher energy state by the photovoltaic effect. As a charge carrier moves to a higher energy state, for example, as an electron is excited from a valence band to a conduction band, a minimum activation energy is required to overcome the band gap and mobilize the charge carrier to conduct electric current. Semiconductor conductivity is proportional to the product of charge carrier mobility and charge carrier concentration.

Dopants are used in semiconductor materials of photovoltaic devices to modulate Fermi level and increase charge carrier concentration. The addition of dopants to a semiconductor may be used to produce a material with predominantly negative, n-type, or positive, p-type, charge carriers.

In CdTe-based photovoltaic devices, the relatively low open circuit voltage (Voc) in relation to the band gap of the material is due, in part, to the low majority carrier concentration and short minority carrier lifetime in CdTe. Effective carrier concentration of CdTe may be improved by doping with p-type dopants. Further issues that limit the device efficiency of CdTe solar cells include the high work function of CdTe and high back-contact resistance at the interface between CdTe and metal-based back contact layer. The back-contact resistance may be improved by increasing the majority carrier concentration at the back interface. For example, for a p-type CdTe material, increasing the carrier concentration amounts to increasing the p-type carriers in the CdTe material to form an "ohmic contact layer" on the backside of the CdTe layer, which is in contact with the back contact layer.

While dopants have been successful to some extent in modulating Fermi level and increasing charge carrier concentration, some dopants have also been found to contribute to device degradation, migrate under operating conditions, contribute to carrier recombination, or generate fewer mobile charge carriers than predicted.

For example, copper has been used to p-dope type I-VI semiconductor materials, such as CdTe. Copper dopants are highly mobile and migrate over time under bias. The copper dopants do not stay fixed in the crystal lattice of polycrystalline thin films. Through these mechanisms, dopants may detrimentally affect device lifetime, long-term stability, and performance.

There are three potential types of p-dopants for polycrystalline CdTe: substitution of Cd with a single-acceptor metal, such as copper or silver, vacancy of a Cd site; and substitution of Te with a group V element. As discussed in U.S. Patent Publication No. 2012/0042950, substitution of Te with a group V element has been viewed as nearly impossible because the Te-substitution is thermodynamically unfavorable over a Cd-substitution. Additionally, the higher vapor pressure of Cd, compared with Te, leads to Cd evaporating more readily from films to form Te-rich and Cd-deficient films under the high temperature processing conditions used in photovoltaic device manufacture. Thus, reliable substitution of Te with a group V element in a polycrystalline CdTe thin film in a photovoltaic stack has been unachievable.

It has been challenging to effectively dope CdTe and CdTe alloys to reach a desired concentration of mobile p-type charge carriers in efficient and stable devices. A further challenge is to produce such devices using scalable and cost-effective manufacturing processes. Thus, it is desirable to provide improved photovoltaic devices and methods of forming doped semiconductor materials.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals.

FIG. 13A shows a DSIMS profile of arsenic dopant in the treated device. FIG. 13B shows CV measurements of charge carrier concentration. FIG. 13C shows I-V curves for the arsenic-doped device with a measured $V_{OC}$ of 883 mV.

FIG. 14A shows QE measurements for the arsenic-doped device. FIG. 14B shows CV measurements of charge carrier concentration. FIG. 14C shows an I-V curve for the device with a measured $V_{OC}$ of 806 mV and a FF of 78.3%.

DETAILED DESCRIPTION

Figure 1:
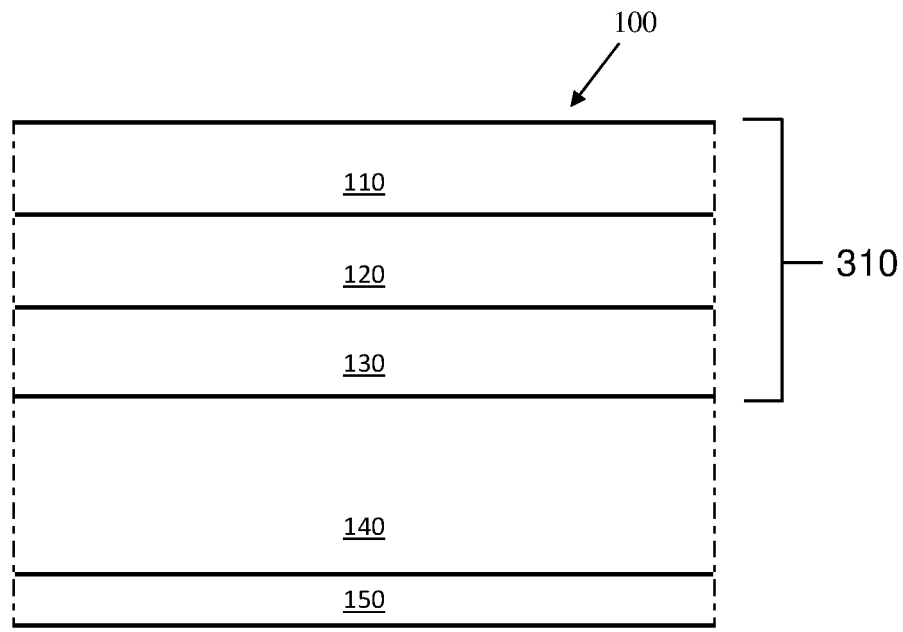
FIG. 1 depicts a schematic of functional layers in an embodiment of a photovoltaic device.

Provided are methods, structures, and compositions for use in photovoltaic (PV) devices. Embodiments provide thin film photovoltaic devices having a p-type absorber layer. Embodiments include methods for p-type doping of polycrystalline thin films of II-VI semiconductors with group V dopants and heat treatment in a reducing environment to achieve high hole density in efficient and stable devices. Embodiments include II-VI semiconductor absorber layers having a group V dopant incorporated into a polycrystalline lattice at vacancies of a group VI semiconductor element.

The detailed description provided below in connection with the appended drawings is intended as a description of examples and is not intended to represent the only forms in which the examples may be constructed or utilized. As used herein, the word "exemplary" means "serving as an example, instance, or illustration." Thus, any embodiment described herein as "exemplary" is not necessarily to be construed as preferred or advantageous over other embodiments. All of the embodiments described herein are provided to enable persons skilled in the art to make or use the embodiments described herein and not to limit the scope of the disclosure which is defined by the claims. Furthermore, there is no intention to be bound by any expressed or implied theory presented herein.

In the specification, drawings, and in the claims, the embodiments related to the methods are not limited by a particular sequence of steps, unless the context clearly indicates otherwise. Thus, in some embodiments, two or more of the steps of a method may be performed simultaneously. Alternatively, in some other embodiments, two or more of the steps of a method may be performed sequentially. The embodiments related to the methods are not limited to the order of appearance of the steps in the claims, drawings, or in the specification. Process steps may be sequentially interchanged, as long as the resulting sequence is not logically inconsistent. Relational terms, such as first and second, may be used to distinguish one entity or action from another entity or action without requiring or implying sequential relationship or order between such entities or actions, unless specified.

In the following specification and the claims, the singular forms "a", "an" and "the" include plural referents unless the context clearly dictates otherwise. As used herein, the term "or" is not meant to be exclusive and refers to at least one of the referenced components being present and includes instances in which a combination of the referenced components may be present, unless the context clearly dictates otherwise.

Thin film photovoltaic devices are typically made of various layers of different materials, each serving a function, formed on a substrate. A thin film photovoltaic device includes a front electrode and a back electrode to provide electrical access to the photoactive semiconductor layer or to other layers that are sandwiched there-between.

Each of the layers described in the following embodiments may be composed of more than one layer or film. Each layer can cover all or a portion of the PV device and/or all or a portion of the layer or material underlying the layer. For example, a "layer" can mean any amount of material that contacts all or a portion of a surface. During a process to form one of the layers, the created layer forms on an outer surface, typically a top surface, of a substrate or substrate structure. The substrate may include a base layer introduced into a deposition process and any other or additional layers that may have been deposited onto the base layer in a prior deposition process or processes. Layers may be deposited over the entirety of a substrate with certain portions of the material later removed through laser ablation, scribing, or other material-removal process.

The manufacturing of a photovoltaic device generally includes sequentially disposing the functional layers or layer precursors in the stack through one or more processes, including, but not limited to, sputtering, spray, evaporation, molecular beam deposition, pyrolysis, closed space sublimation (CSS), pulse laser deposition (PLD), chemical vapor deposition (CVD), electrochemical deposition (ECD), atomic layer deposition (ALD), or vapor transport deposition (VTD). Conditions may be modulated during deposition and the presence or absence of reactants and precursor compounds may be modulated to modify a layer during formation. Once a layer is formed it may be desirable to modify the physical characteristics of the layer through subsequent treatment processes.

Photovoltaic devices generally comprise multiple layers of material disposed on a substrate. The layers include a semiconductor absorber for converting photon energy to electrical current, and front and back contacts that collect and conduct the generated current to or from the device. A p-n junction can be formed using one or more layers of material such as, for example, a homojunction or a heterojunction. Functionally, the one or more layers of material can include the absorber layer, a window layer, a buffer, a transparent layer, an interfacial layer, or combinations thereof. Many other layers may optionally be present to improve the performance of the device.

In the present disclosure, when a layer is being described as being disposed or positioned "on" another layer or substrate, it is to be understood that the layers can either be directly contacting each other or have one (or more) layer or feature between the layers. Further, the term "on" describes the relative position of the layers to each other and does not necessarily mean "on top of" since the relative position above or below depends upon the orientation of the device to the viewer. Moreover, the use of "top," "bottom," "above," "below," and variations of these terms is made for convenience, and does not require any particular orientation of the components unless otherwise stated. However, the orientation remains consistent within each embodiment or example, such that if B is "on" A, and C is "on" B, then B is necessarily between A and C, though not necessarily in contact with either. In the present disclosure, when an object is being described as being "adjacent," it is to be understood that the word adjacent means "next to" and "in direct contact with" another object and is not synonymous with the term "on," although one object can be "on" and "adjacent" to another object.

Approximating language, as used herein throughout the specification and claims, may be applied to modify any quantitative representation that could permissibly vary without resulting in a change in the basic function to which it is related. Accordingly, a value modified by a term or terms, such as "about", "approximately," and "substantially" is not to be limited to the precise value specified. In some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

Embodiments of the present disclosure are directed to methods for treating a semiconductor layer. The term "semiconductor layer" as used herein refers to a layer of semiconductor material that may be further disposed on one or more other layers. In some embodiments, the semiconductor layer includes an absorber layer. The term "absorber layer" as used herein refers to a semiconducting layer wherein the absorption of electromagnetic radiation causes electrons in the absorber layer to be excited from a lower energy "ground state" or "valence band" in which they are bound to specific atoms in the solid, to a higher "excited state," or "conduction band" in which the charge carriers can move about within the solid.

The term "chalcogenide" as used herein refers to a compound of at least one chalcogen and at least one electropositive element. The term "chalcogen" refers to tellurium, selenium, or sulfur. Suitable chalcogenide materials include binary, ternary, or quaternary compounds, such as cadmium telluride, magnesium telluride, mercury telluride, lead telluride, zinc telluride, cadmium selenide, mercury selenide, lead selenide, zinc selenide, cadmium sulfide, mercury sulfide, zinc sulfide, lead sulfide, cadmium selenium telluride, cadmium zinc telluride, cadmium sulfur telluride, cadmium manganese telluride, cadmium magnesium telluride, or combinations thereof. The above-mentioned semiconductor materials may be used alone or in combination. Further, these materials may be present in more than one layer, each layer having different type of semiconductor material or having combinations of the materials in separate layers. In certain embodiments, the semiconductor layer includes cadmium telluride (CdTe). In certain embodiments, the semiconductor layer includes p-type CdTe. In certain embodiments, the semiconductor layer consists essentially of CdTe. In certain embodiments, the semiconductor layer includes cadmium selenium telluride (CdSeTe).

Embodiments of the present disclosure include photovoltaic devices comprising II-VI semiconductors. At the atomic level, these semiconductor materials tend to form lattice structures such that the group I elements, such as cadmium and zinc, are in stoichiometric equilibrium with, and approximately equal to, the group VI elements, such as sulfur, selenium, and tellurium. In some embodiments, a layer composition is modulated to be "rich" in one or more elements. For example, a Cd-rich layer in a CdTe layer would have more cadmium than tellurium.

A composition of a layer may be described as "substantially homogenous" across a thickness of the layer. Unless otherwise specified, "substantially homogeneous" indicates that the composition, by atomic ratio or by dopant concentration, varies by less than 10% in the specified region.

A gradient of a dopant or semiconductor alloy composition may be formed across a thickness of a layer. The gradient may be formed in one or more ways, for example, by depositing materials with a selected material profile, by varying conditions during deposition of a layer, or the gradient may be formed by depositing discrete layers of material that are subsequently annealed to create a desired concentration profile. The gradient may be a continuous increase in concentration, a stepwise change in concentration or the like. Such a gradient may apply to atomic ratios within a ternary or quaternary alloy, wherein the atomic ratio varies throughout the thickness of the absorber, or a gradient may apply to a dopant in the layer. Grading can be used to tune the bandgaps of CdTe based alloys, to reduce surface recombination, to reduce charge carrier recombination, to provide a diffusion barrier, to provide a buffer, to improve ohmic contact, and/or increase absorption of the solar spectrum to improve the power conversion efficiency.

The power output of a PV device is the product of the current (I, or sometimes J, current density per unit area) and voltage (V) which can be shown by an I-V curve. At zero current or "open circuit," a maximum voltage is produced ($V_{OC}$) and at zero voltage or "short circuit," a maximum current is produced ($I_{SC}$). The product of these is the total potential power ($P_T$), given in watts (W), but this is not achievable in reality. The maximum power output ($P_{MAX}$) achievable is defined by the point on the IV curve that gives the largest product, $I_{MP}*V_{MP}$. Fill Factor (FF) is defined as the ratio of $P_{MAX}$ to $P_T$, i.e. the product of $I_{MP}*V_{MP}$ divided by the product of $I_{SC}*V_{OC}$. Higher FF is indicative of a more efficient cell. The conversion efficiency of a PV device is the ratio of the total potential power ($P_T$) discounted by FF, over the total incident power ($P_{in}$), and may be represented mathematically as: Efficiency=$(I_{SC}*V_{OC}*FF)/P_{in}$.

As used herein, the term "effective carrier density" refers to the average concentration of holes or electrons in a material. As used herein, "n-type layer" refers to a semiconductor layer having an excess of electron donors as majority carriers; while a "p-type layer" refers to a semiconductor layer having an excess of electron acceptors (also known as "holes") as majority carriers. In each case the excess carriers (electrons or holes) may be provided by chemically doping the semiconductor with suitable dopants or may be generated by intrinsic defects present in the material.

Semiconductors doped to be p-type or n-type are sometimes further characterized based on the density of respective majority charge carriers. Although the boundaries are not rigid, a material is generally considered p-type if electron acceptor carriers (i.e. "holes") are present in the range of about $1\times10^{11}$ cm$^{-3}$ to about $1\times10^{16}$ cm$^{-3}$, and p+ type if acceptor carrier density is greater than about $1\times10^{16}$ cm$^{-3}$. Similarly, a material is considered n-type if electron donor carriers are present in the range of about $1\times10^{11}$ cm$^3$ to about $1\times10^{16}$ cm$^{-3}$, and n+ type if donor carrier density is greater than about $1\times10^{16}$ cm$^{-3}$. The boundaries are not rigid and may overlap because a layer may be p+ relative to a layer that is p-type (or n+ relative to a layer that is n-type) if the carrier concentration is at least 2 orders of magnitude (i.e. 100-fold) higher, regardless of the absolute carrier density. Additionally, some consider charge densities of greater than about $1\times10^{11}$ cm$^{-3}$ to be "++" type; and thus a layer of either n-type or p-type can be "++" relative to a layer of the same type that is itself "+" relative to yet a third layer, if the ++ layer has a same-type carrier density more than 100 fold that of the + layer.

In the following description, references are made to the accompanying drawings that form a part hereof, and which are shown by way of illustration, specific embodiments, or examples. Referring now to the drawings, in which like numerals represent like elements through the several figures, aspects of a photovoltaic device and manufacturing process are described.

FIG. 1 depicts a photovoltaic device 100 according to an embodiment of the present disclosure, wherein a number of layers are shown and described. The layers described, the materials used, and/or the methods of forming the layers of the photovoltaic device 100 may be substituted, included in addition to layers described, or be absent in the embodiments described herein below and illustrated in the figures. It is further understood that each of the layers may be deposited in a single layer deposition from a single material, from a multi-layer process from a single material, or from a multi-layer process from a plurality of materials.

The photovoltaic device 100 of FIG. 1 includes a substrate layer 110, a front contact layer 120, a transparent n-type layer 130, a p-type absorber layer 140, and a back contact layer 150. In some embodiments, the front contact layer 120 is also the transparent n-type layer 130. Accordingly, the transparent n-type layer 130 can be omitted.

The term "transparent layer" as used herein, refers to a layer that allows an average transmission of at least 70% of incident electromagnetic radiation having a wavelength in a range from about 300 nm to about 1,300 nm such as, for example, about 400 nm to about 800 nm. In some embodiments, transparent layers may transmit electromagnetic radiation over a broader range of wavelengths, which may include infrared or ultraviolet wavelengths.

In an exemplary embodiment, light enters through the substrate layer 110, passes through the front contact layer 120 and transparent n-type layer 130, to the p-type absorber layer 140 where it is absorbed, inducing the emission of charge carriers. A heterojunction between the p-type absorber layer 140 and the transparent n-type layer 130 forms a p-n junction, allowing directional flow of charge carriers. Current is then carried by the front contact layer 120 and back contact layer 150.

The photovoltaic device 100 further includes electrical connections that provide a current path to communicate generated current flow, such as, from one photovoltaic cell to adjacent cells in a module, or from one photovoltaic module to adjacent modules in an array. Alternatively, the electrical connections may direct the current flow to an external load device where the photo-generated current provides power.

The substrate layer 110 provides a surface upon which layers of material are disposed to create the photovoltaic device. The substrate layer 110 comprises any suitable substrate, such as soda lime glass, float glass or low-iron glass. Alternatively, the substrate layer 110 may include polymeric, ceramic, metallic, or other materials that provide a suitable structure for forming a base of a photovoltaic cell. The substrate is not essential, but is a practical medium for applying the subsequent layers. Although layers are generally described herein in a superstrate configuration, in which front-side light is incident through the substrate, a true "substrate" configuration, in which the substrate is on the side of the back contact, is also suitable for use with described methods.

In some embodiments, the device 100 may further include one or more of: an antireflective layer, an anti-soiling layer, an encapsulant, an interface layer, a buffer layer, a capping layer, and an optical reflective layer.

Figure 2:
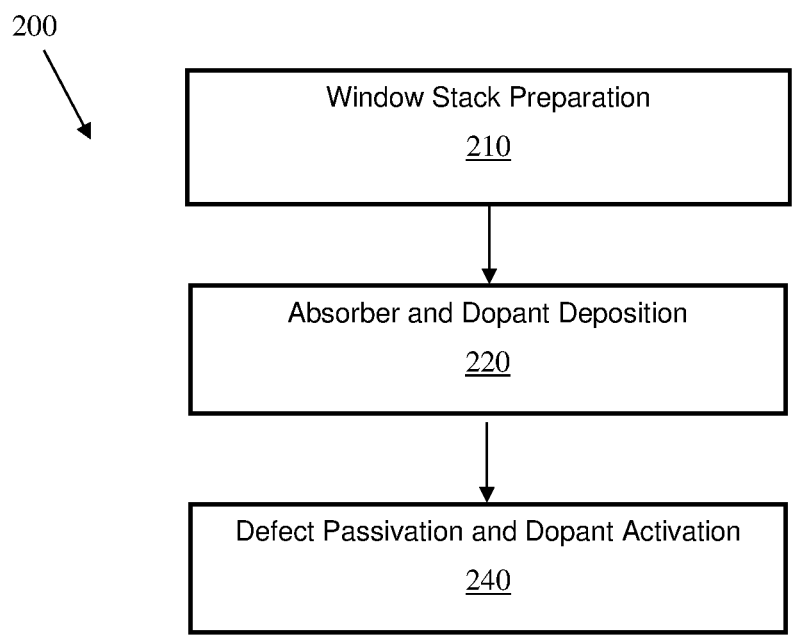
FIG. 2 depicts an exemplary method of forming and treating the absorber layer of the photovoltaic device according to an embodiment of the present disclosure.

FIG. 2 depicts an exemplary method 200 of forming and treating an absorber layer 140. With collective reference to FIGS. 1 and 2, a partially formed device comprising a window stack 310 is prepared 210 and is placed into a deposition chamber. In some embodiments, the window stack 310 comprises a substrate layer 110, a front contact layer 120, and a transparent n-type layer 130. In some embodiments, the window stack 310 comprises a substrate layer 110 made of glass, a transparent conductive oxide (TCO) on the substrate layer 110, and an un-doped semiconductor layer on the TCO. In some embodiments, the window stack 310 comprises a substrate layer, a transparent conductive oxide (TCO) adjacent the substrate layer, a high-resistance transparent (HRT) layer adjacent the TCO, and one or more semiconductor layers on the HRT layer.

Figure 3:
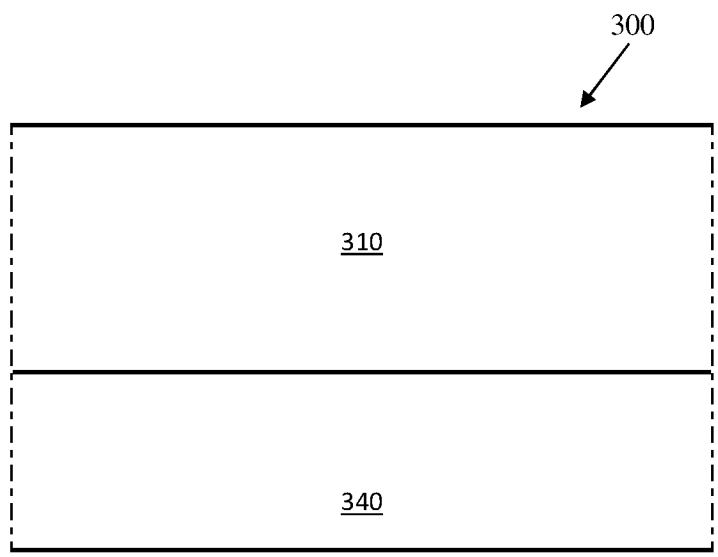
FIG. 3 depicts a schematic of functional layers of a photovoltaic stack in a partially-formed device.

During an absorber deposition step 220, a type II-VI semiconductor material and a pnictogen dopant are deposited on the window stack 310 of the partially formed device to form a photovoltaic stack 300, as shown in FIG. 3, comprising a doped absorber layer 340 on the window stack 310. In some embodiments, a dopant is co-deposited to form a photovoltaic stack 300 having a doped absorber layer 340 that is substantially uniformly doped. In some embodiments, during a deposition step 220, a type II-VI semiconductor material is deposited and a dopant is deposited sequentially before or after the semiconductor material. The dopant subsequently diffuses into the semiconductor layer and forms the doped absorber layer 340 with a dopant gradient across the thickness of the layer. In an embodiment, CdTe is the II-VI semiconductor material. In an embodiment, the II-VI semiconductor material is CdTe alloyed with one or more of: CdS, CdSe, ZnTe, and HgTe.

Doping a semiconductor layer, such as CdTe, can be performed in several ways. For example, a dopant can be supplied along with a CdTe source during deposition. The dopant can be introduced as a powder (i.e. a single or multiple phase material) or in a carrier gas. A dopant can be introduced by deposition of one or more layers during, prior to, following, or interspersed with a semiconductor layer deposition. For example, an adjacent layer may contain a dopant, which can diffuse into the CdTe layer. In some embodiments, the semiconductor material is a chalcogenide and the dopant or dopant precursor comprises a group V element. In some embodiments a plurality of dopants are deposited during the deposition step 220, at least one of which comprises a pnictogen.

In an exemplary embodiment, the semiconductor material comprises CdTe deposited by molecular beam epitaxy (MBE) with a pnictogen dopant. In another exemplary embodiment, the semiconductor material comprises CdTe deposited with an arsenic dopant by thermal evaporation of CdTe with $Cd_2As_3$ or $AsH_3$. In an exemplary embodiment, the semiconductor material comprises a CdTe alloy deposited with a pnictogen dopant by vapor transport deposition (VTD). In some embodiments, the semiconductor is deposited by VTD using a blended or alloyed powder consisting essentially of the elements cadmium, tellurium, and arsenic. In an embodiment, the mole fraction of the pnictogen in the source material is 0.05% to 5.0%. In an exemplary embodiment with an arsenic dopant, a concentration of arsenic in the absorber film is about $1\times10^{16}$ $cm^{-3}$ to about $5\times10^{20}$ $cm^{-3}$. In some embodiments with an arsenic dopant, a concentration of arsenic in the absorber film is about $1\times10^{18}$ $cm^{-3}$ to about $5\times10^{18}$ $cm^{-3}$. In an exemplary embodiment with an antimony dopant, a concentration of antimony in the absorber film is about $1\times10^{17}$ $cm^{-3}$ to about $2\times10^{20}$ $cm^{-3}$. In another exemplary embodiment, a phosphorus dopant is incorporated by thermal evaporation of the semiconductor material with cadmium phosphide ($Cd_3P_2$). In another exemplary embodiment, an antimony dopant is incorporated by thermal evaporation of the semiconductor material with antimony telluride ($Sb_2Te_3$), cadmium-antimony alloy, or metallic antimony. Suitable doping precursors include, but are not limited to: $Cd_3As_2$, $As_2Se_3$, $AsH_3$, $Bi_2Te_3$, $Sb_2Te_3$, $Cd_3P_2$, $Zn_3P_2$, $Bi(NO_3)_3$, $Bi_2S_3$, $PCl_3$, $PH_3$, $SbH_3$ and $AsCl_3$, as well as dopants in their elemental form. Suitable doping precursors include alloys of compounds listed above with CdTe or other II-VI materials.

An exemplary deposition chamber includes a deposition distributor connected to a deposition vapor supply. The distributor can be connected to multiple vapor supplies for deposition of various layers or the substrate can be moved through multiple and various deposition stations with its own vapor distributor and supply.

In an embodiment, the deposition chamber is substantially free of oxygen gas or water vapor during the dopant and absorber deposition step 220. For example, the deposition chamber can be considered substantially oxygen-free. As used herein, substantially oxygen-free can mean that the partial pressure in the chamber due to oxygen is less than about 1 Torr (about 133 Pa) such as, for example, less than about 500 milliTorr (about 67 Pa) in one embodiment, less than about 100 milliTorr (about 13 Pa) in another embodiment, in a range of a trace amount to about 500 milliTorr (about 67 Pa) in a further embodiment, or in a range of a trace amount to about 25 milliTorr (about 3 Pa) in yet another embodiment. Likewise, the chamber can be considered substantially water vapor-free. As used herein, substantially water vapor-free can mean that the partial pressure in the deposition chamber due to water vapor is less than about 1 Torr (about 133 Pa) such as, for example, less than about 500 milliTorr (about 67 Pa) in one embodiment, less than about 250 milliTorr (about 33 Pa) in another embodiment, or less than about 100 milliTorr (about 13 Pa) in a further embodiment. As used herein, the phrase "trace amount" can mean some amount greater than zero and less than about $10^{-6}$ Torr (about 104 Pa), which was the detection limit of the equipment used for testing. In a further embodiment, the deposition conditions further comprise supplying a chemical reducer to the deposition chamber during the dopant and absorber deposition step 220. The dopant and absorber deposition step 220 produces a photovoltaic stack 300.

During a treatment step 240, the photovoltaic stack 300 is thermally processed, contacted with a passivation agent, and a reducing agent is supplied. The reducing agent can be energetically more favorable to oxidation than the group V dopant, i.e., an oxidation reaction of the reducing agent in the chamber can have a more negative Gibbs free energy change ($\Delta G$) than the group V dopant. The photovoltaic stack 300 is maintained in a reducing environment at an elevated temperature. In some embodiments, the treatment step 240 further comprises low pressure conditions.

A passivation agent is supplied at the treatment step 240. In some embodiments, the passivation agent is $CdCl_2$. Other suitable passivation agents include $MnCl_2$, $MgCl_2$, $NH_4Cl$, $ZnCl_2$, or $TeCl_4$. The passivation agents may be used alone or in combination. In some embodiments, the photovoltaic stack 300 is contacted with a passivation agent while in a reducing environment, at an elevated temperature. In other embodiments, the photovoltaic stack 300 is contacted with a passivation agent and subsequently placed in a reducing environment at an elevated temperature.

In some embodiments, the reducing agent is or includes $H_2$. In some embodiments, the reducing agent can be provided as a component of a forming gas consisting essentially of a mixture of the reducing agent and an inert gas e.g., a mixture of $H_2$ and $N_2$. Other suitable reducing agents include methane ($CH_4$), carbon monoxide (CO), hydrogen sulfide ($H_2S$), and ammonia compounds ($NH_3$). In an embodiment, the treatment step comprises supplying an environment having a mixture of about 50.0% $N_2$ to 99.4% $N_2$ and about 0.6% $H_2$ to about 3.0% $H_2$. In an embodiment, the treatment step comprises supplying gas to a chamber to produce an environment comprising $H_2$. As provided herein, the chamber can be substantially oxygen-free. Alternatively or additionally, the chamber can be substantially water vapor-free. In an embodiment, the treatment step comprises supplying gas to a chamber to produce an environment consisting essentially of 100% $H_2$. In an embodiment, the treatment step comprises supplying an environment comprising $H_2$ in an atomic fraction range of about 0.5% to about 100% such as, for example, in a range of about 0.06% $H_2$ to about 3.0% $H_2$ in one embodiment, or in a range of about 0.6% $H_2$ to about 3.0% $H_2$ in another embodiment. In an embodiment, the treatment step comprises supplying hydrogen gas to a chamber, wherein the partial pressure of $H_2$ in the chamber is in a range of about 0.24 Torr (about 32 Pa) to about 50 Torr (about 6,666 Pa) such as, for example, in a range of about 3 Torr (about 400 Pa) to about 50 Torr (about 6,666 Pa) in one embodiment, in a range of about 2.4 Torr (about 320 Pa) to about 12 Torr (about 1,600 Pa) in another embodiment, in a range of about 4.2 Torr (about 560 Pa) to about 21 Torr (about 2,800 Pa) in a further embodiment, or in a range of about 3 Torr (about 400 Pa) to about 15 Torr (about 2,000 Pa) in yet another embodiment. As noted above, the chamber can be substantially oxygen vapor free. Accordingly, the chamber can have a ratio of partial pressure of the reducing agent to oxygen of greater than about 0.24 such as, for example, greater than about 3 in one embodiment, greater than about 100 in another embodiment, or greater than about 1,000 in a further embodiment.

In some embodiments, the elevated temperature is a temperature of more than about 300° C., more than about 350° C., more than about 400° C., less than about 800° C., less than about 600° C., less than about 550° C., or less than about 500° C. The one or more photovoltaic stacks may be thermally processed for a suitable duration, including, for example, more than about 5 minutes, more than about 15 minutes, more than about 20 minutes, more than about 30 minutes, more than about 30 minutes, less than about 90 minutes, less than about 60 minutes, or less than about 40 minutes.

Without wishing to be bound by theory, it is suggested that a heating step performed in a reducing environment, creates Te vacancies and promotes movement of the group V dopant to the Te vacancy site. In some embodiments, the temperature and pressure of the reducing environment is sufficient to induce or promote a reaction, between hydrogen gas in the reducing environment and a semiconductor layer containing a CdTe alloy, to form hydrogen telluride ($H_2Te$). In some embodiments, the selected temperature and pressure is below a phase transition temperature of the absorber film.

During the treatment step 240, anions of the group I-VI semiconductor compound react with $H_2$, or other reducing agent, and/or with the passivation agent, such as $CdCl_2$, to form volatile species such as $TeCl_2$ and $H_2Te$, depleting chalcogen elements from the layer. This promotes further activation of the incorporated dopant during the recrystallization after forming the chalcogen vacancy. For example, in CdTe, a group V dopant occupies a Te vacancy formed in the polycrystalline lattice through the $H_2$—Te reaction formation of volatile $H_2Te$. Further examples include reaction of $H_2$ with compounds such as ZnTe, CdS, or CdSe. Without wishing to be bound by theory, it is suggested that passivation and heat treatment, in a reducing environment, promotes Te-vacancies ($V_{Te}$) and Cd-enrichment, incorporation of the group V element dopant into the crystal lattice at the Te vacancy (ex. —$Bi_{Te}$, $Sb_{Te}$, $As_{Te}$, $P_{Te}$), and thus promotes activation of the dopant. The step also achieves grain boundary passivation and defect passivation through chlorination.

In an exemplary embodiment of treatment step 240, a photovoltaic stack having a doped CdTe absorber layer 340 was coated with a thin layer of $CdCl_2$ in a CSS system to produce a $CdCl_2$ coating over the absorber layer 340. The $CdCl_2$ may also be supplied as a vapor during heat treatment, as described in U.S. Pat. No. 9,318,642, which is hereby incorporated by reference, and may be performed with an addition of a reducing agent. The $CdCl_2$ layer can also be supplied by spin coating, spray, or roll coating, for example. The photovoltaic stack having a $CdCl_2$ coating over the absorber layer 340 was then thermally processed for about 10 minutes to about 20 minutes in a reducing environment having a gas mixture of $N_2$ and $H_2$. The total gas pressure was about 300 Torr (about 39,997 Pa) to about 600 Torr (about 79,993 Pa), in which the partial pressure of $H_2$ was about 3 Torr (about 400 Pa) to about 50 Torr (about 6,666 Pa). The temperature of the substrate 110 during treatment step 240, which included annealing, was in the range of about 375° C. to about 475° C.

In another exemplary embodiment of treatment step 240, the photovoltaic stack 300 is maintained in a heat-treating environment at a pressure in a range of about 200 Torr to about 800 Torr, a temperature in a range of about 350° C. to about 500° C., and a reducing environment comprising a partial pressure of hydrogen in a range of about 3 Torr (about 400 Pa) to about 50 Torr (about 6,666 Pa) for about 5 minutes to about 45 minutes. In a further exemplary embodiment of treatment step 240, the photovoltaic stack is maintained in a chamber at a temperature in a range of about 400° C. to about 500° C. for a duration of about 5 minutes to about 30 minutes, and the chamber is supplied with a reducing environment of nitrogen gas, hydrogen gas, and cadmium chloride vapor. The chamber can be substantially oxygen-free.

Figure 4:
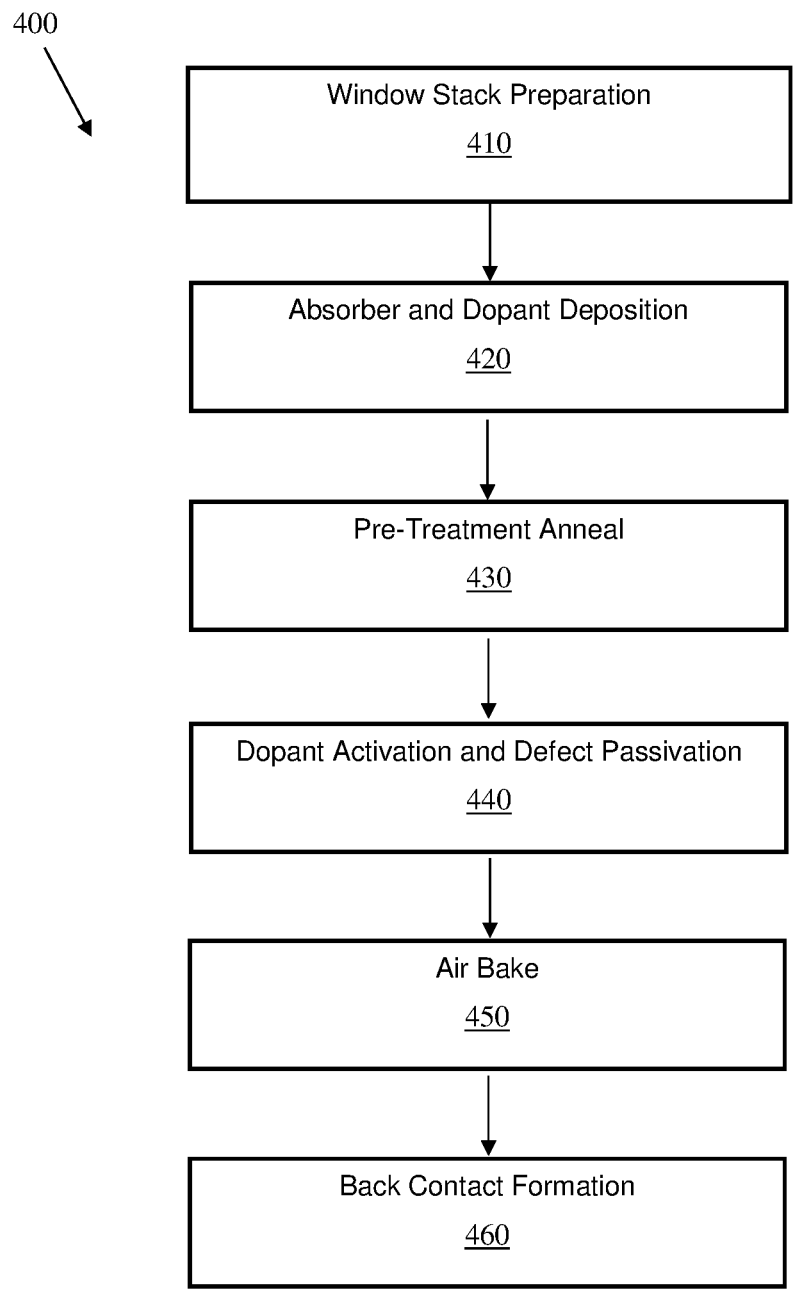
FIG. 4 is a flowchart showing an exemplary process of manufacturing a photovoltaic device, including forming and treating the semiconductor layer according to an embodiment of the present disclosure.

Turning now to FIG. 4, an example of a method 400 of forming a device with a doped absorber layer 340 is shown.

A window stack 310 is formed 410. A II-VI semiconductor and dopant are deposited during a deposition step 420 on the window stack 310 to form a photovoltaic stack 300.

During a pre-treatment step 430, the photovoltaic stack 300 is heated and annealed in a substantially oxygen-free environment. In some embodiments, the pre-treatment step 430 is performed under vacuum or at low-pressure. In some embodiments, the pre-treatment step 430 is performed at or below ambient pressure of about 760 Torr (about 101,325 Pa). In some embodiments, the pre-treatment step 430 is performed in a vacuum environment, at a pressure at or below about 0.1 millitorr (about 0.13 Pa). In some embodiments the vacuum environment has a pressure in a range of about $1\times10^{-2}$ Torr (about 1.3 Pa) to about $1\times10^{-9}$ Torr (about $1.3\times10^{-6}$ Pa) such as, for example, about $1\times10^{-4}$ Torr (about 0.13 Pa) to about $1\times10^{-9}$ Torr (about $1.3\times10^{-6}$ Pa). In other embodiments, the pre-treatment step 430 is performed in a low-pressure environment, at a pressure at, or below, about 550 Torr (about 73,327 Pa). In some embodiments the low-pressure environment has a pressure in a range of about 25 Torr (about 3,333 Pa) to about 550 Torr (about 73,327 Pa). In an exemplary embodiment, the photovoltaic stack 300 is annealed under vacuum at a temperature in a range of about 300° C. to about 500° C. (e.g., a range of about 300° C. to about 450° C.) for a duration in a range of about 10 minutes to about 60 minutes.

Without wishing to be bound by theory, it is suggested that pre-treating the doped absorber layer 340 at reduced pressure and at an elevated temperature reduces defects and forms a chemically more uniform absorber film, promotes grain growth, contributes to restoring stoichiometry, and promotes incorporation of the dopant into the bulk of the II-VI semiconductor layer. The pre-treatment step is particularly beneficial for absorber layers deposited at low pressures and temperatures, below about 300° C., such as the conditions used in physical vapor deposition (PVD) techniques.

During a treatment step 440, the photovoltaic stack 300 is contacted with a passivation agent and maintained in a reducing environment at an elevated temperature as described in the process shown in FIG. 2.

During a processing step 450, the photovoltaic stack is maintained in a heated, oxygenated environment. In an exemplary embodiment, the photovoltaic stack is maintained at a temperature in a range of about 150° C. to about 200° C., for a duration of about 30 minutes to about 120 minutes, in air, at or about standard pressure.

During a back contact formation step 460, a back contact material is formed or applied on the photovoltaic stack. Suitable back contact materials, include, but are not limited to: alloys, metal stacks, conductive oxides, and graphite compounds.

The method 400 of FIG. 4 produces an embodiment of a photovoltaic device with a doped absorber layer 340 with the dopant incorporated into crystal lattice of the polycrystalline semiconductor material. In an embodiment, a concentration of the group V dopant in the doped semiconductor absorber layer 340 is between about $5\times10^{16}$ cm$^{-3}$ to about $2\times10^{18}$ cm$^{-3}$ (e.g., about $5\times10^{17}$ cm$^{-3}$ to about $1\times10^{18}$ cm$^{-3}$), and the treated, doped semiconductor absorber layer 340 has a p-type charge carrier concentration in a range of about $5\times10^{15}$ cm$^{-3}$ to $5\times10^{17}$ cm$^{-3}$ (e.g., about $5\times10^{15}$ cm$^{-3}$ to about $5\times10^{16}$ cm$^{-3}$), therefore, the apparent activation rate of the group V dopant is about 0.25 at. % to about 10 at. % (e.g., about 1 at. % to about 5 at. %) of the group V dopant in the absorber layer 340. In an embodiment, a concentration of the group V dopant in the treated, doped semiconductor absorber layer 340 is between about $1\times10^{13}$ cm$^3$ to about $1\times10^{18}$ cm$^{-3}$ throughout a thickness of the absorber layer 340 and about 0.5 at. % to about 5.0 at. % of the group V dopant occupies Te vacancies in a CdTe crystal lattice. In an embodiment, the dopant activation level is about 1% to about 10%, wherein about 1 at. % to about 10 at. % of the group V dopant in the absorber layer occupies VI-type vacancies in a II-VI semiconductor polycrystalline lattice after heating the absorber film in a reducing environment. In an embodiment, the group V dopant activation level is equal to or greater than about 2%.

In an embodiment, the window stack preparation step 410 comprises forming a window layer as described in U.S. Pat. No. 9,082,903. In an embodiment, the window stack preparation step 410 further comprises depositing one or more semiconductor layers on the TCO layer. For example, the window stack preparation step 410 may further comprise depositing a CdS and/or CdSe layer, optionally followed by depositing an undoped CdTe layer on the CdS or CdSe layer. In some embodiments, the absorber and dopant deposition step 420 is performed using a high-temperature process (about 350° C. to 1,200° C.) and without a pre-treatment step to produce a photovoltaic device with a doped absorber layer with the dopant incorporated into crystal lattice of the polycrystalline semiconductor material. In an exemplary embodiment, the window stack preparation step 410 is followed by an absorber and dopant deposition step 420 of a pnictogen dopant with a CdTe deposition performed by VTD at a temperature of about 450° C. to about 600° C. and deposited on the semiconductor layer of the window stack 310, to form a photovoltaic stack 300. The photovoltaic stack is then treated in a defect passivation and dopant activation step 440. In the defect passivation and dopant activation step 440, the photovoltaic stack 300 is treated with heat, $CdCl_2$ and $H_2$ in a substantially oxygen-free reducing environment. Example conditions include a total pressure of about 250 Torr (about 33,330 Pa) to about 760 Torr (about 101,325 Pa), with a partial pressure of hydrogen at about 3 Torr (about 400 Pa) to about 20 Torr (about 2,666 Pa), at a temperature of about 350° C. to about 475° C., for a total duration of between about 5 minutes to about 90 minutes.

During the treatment step 440, defects are passivated and the pnictogen dopant is activated, whereby atoms of the pnictogen dopant occupy a tellurium position within the crystal lattice. The processing of the photovoltaic stack 300 by the treatment step 440, may result in an absorber layer 340 having a thickness of about 0.5 microns to about 3.5 microns such as, for example, a thickness between about 1 micron to about 3 microns in one embodiment, a thickness of about 1.0 micron in another embodiment, or a thickness of about 3.0 microns in a further embodiment.

During this treatment step 440, or in a separate anneal step, the absorber layer 340 may be annealed with an adjacent semiconducting layer at the back side surface of the window stack 310 to form an absorber layer 340 having a graded composition, with the absorber layer 340 comprising, for example, an alloy of cadmium, tellurium, and selenium or sulfur. The treatment process may consume substantially all of an adjacent semiconductor layer, for example a CdS and/or CdSe layer, or a portion of an adjacent semiconductor layer, such as a CdS and/or CdSe layer, may remain between the TCO layer of the window stack and a doped CdSeTe/CdTe absorber layer 340. Similarly, the treatment process may blend substantially all of the adjacent semiconductor layer at the back side surface of the window stack into the doped CdTe layer, or a portion of the CdTe layer may remain substantially free of selenium or sulfur adjacent the back contact.

Following the defect passivation and dopant activation treatment step 440, the surface of the absorber is cleaned and a back contact is formed 460. In some embodiments, the back contact may include ZnTe and be formed as described in U.S. Patent Publication No. 2014/0261667.

In some embodiments, the photovoltaic stack 300 is processed through selected steps. In some embodiments, some steps are combined or omitted. In an exemplary embodiment, the partially formed device progresses sequentially only through: an absorber deposition step 420, wherein a chalcogenide and a dopant are deposited to form the photovoltaic stack 300; a pre-treatment step 430, wherein the photovoltaic stack is annealed in a substantially oxygen-free and low-pressure environment; and a treatment step 440, wherein the photovoltaic stack 300 is passivated and heat-treated in a reducing environment. In another exemplary embodiment, the partially formed device progresses sequentially from an absorber deposition step 420 wherein a chalcogenide and a dopant are deposited to form the photovoltaic stack 300; to a treatment step 440, wherein the photovoltaic stack 300 is passivated and heat-treated in a reducing environment resulting in dopant activation.

In some embodiments, the photovoltaic stack 300 is processed through all steps of 420, 440, and 460 sequentially. In some embodiments, the photovoltaic stack 300 is processed through all of steps 410, 420, 430, 440, 450, and 460 sequentially. In some embodiments the processing steps are performed sequentially and immediately, with substantially no intervening time between the steps. In some embodiments the processing steps are not performed immediately. In some embodiments steps are repeated. In some embodiments one or more intervening steps are performed, for example: a cooling step, a cleaning step, a chemical rinse, a passivation step, an additional annealing step, an additional dopant deposition, and/or deposition of an intermediate layer—such as a buffer layer, electron reflection layer, or optical reflection layer. In some embodiments, one or more additional layers are applied on the absorber layer 340 of the photovoltaic stack 300 prior to the back contact formation.

Examples

CdTe:As Samples

Samples were prepared by depositing a transparent conductive oxide (TCO), for example, fluorine-doped tin oxide, on a glass substrate, followed by deposition of a window layer on the TCO to form a set of window stack components. A cadmium telluride (CdTe) layer was then deposited on the window layer. The CdTe deposition and treatment process was performed, as further described below: with and without an arsenic dopant; with and without a post-deposition, pre-treatment vacuum annealing step; and with an activation heat treatment with $CdCl_2$ in a reducing environment or in an inert environment.

In a set of samples, a layer of arsenic-doped cadmium telluride was deposited on the window layer, of the window stack component. The arsenic-doped cadmium telluride (CdTe:As) layer had a substantially homogeneous arsenic doping level of about $1 \times 10^{18}$ cm$^{-3}$.

A set of the resulting photovoltaic stacks were then subjected to a vacuum annealing pre-treatment process at about 300° C. to about 420° C. for about 20 minutes to about 60 minutes.

The pre-treated components were then subjected to a $CdCl_2$ heat treatment at about 350° C. to about 500° C. for about 5 minutes to about 40 minutes in either a reducing or an inert atmosphere. About 1 µm of $CdCl_2$ was applied by vapor deposition to the absorber surface. During the heat treatment, the pressure was maintained at a total pressure in the range of about 400 Torr to about 800 Torr. The reducing environment consisted essentially of nitrogen and hydrogen, i.e., the reducing environment was substantially oxygen-free and substantially water vapor-free. The inert gas of the reducing environment consisted essentially of nitrogen. Sets of components were treated in various reducing environments supplied with an inert gas of nitrogen with selected levels of forming gas. The forming gas used was 3% $H_2$ and 97% $N_2$. Accordingly, the forming gas was diluted with the inert gas to perform the testing described herein.

Samples were then placed at ambient pressure in an air environment at about 170° C. for about 1 hour. A metal back contact was then applied.

CdTe:As/CdSe Samples

Samples were prepared by depositing a TCO on a glass substrate, followed by deposition of an oxide window layer on the TCO, and followed by deposition of a cadmium selenide (CdSe) layer to form a set of window stack components. A cadmium telluride (CdTe) layer with an arsenic dopant was then deposited on the CdSe layer, to form a set of photovoltaic stacks with an arsenic-doped absorber layer. Samples deposited at a temperature below about 350° C. were subjected to a vacuum anneal pre-treatment, while samples deposited by high-temperature processes were not pre-treated. The photovoltaic stacks were then subjected to an activation treatment of $CdCl_2$ heat treatment in selected reducing environments formed using the forming gas and an inert control. $CdCl_2$ can be applied as a liquid, powder, or vapor immediately preceding, or during, the heat treatment with a reducing agent. The absorber surface of the samples was contacted with $CdCl_2$ vapor, for a duration in a range of about 10 minutes to about 180 minutes, in a reducing environment with a temperature in a range of about 350° C. to about 450° C. and a total pressure of about 400 Torr (about 53,329 Pa) to about 700 Torr (about 93,326 Pa) in an environment supplying a reducing agent. The reducing agent used with this set of samples was provided by a forming gas. The forming gas contained about 3% hydrogen and about 97% nitrogen. The reducing agent was supplied at a selected concentration with nitrogen providing the remaining balance of the suppled gas to the reducing environment. The inert control contained 100% nitrogen. The total pressure can be provided by, optionally, diluting the forming gas with any amount of the inert control. Accordingly, in the tested embodiments the maximum partial pressure of the reducing agent (i.e., $H_2$) was between about 12 Torr (about 1,600 Pa) to about 21 Torr (about 2,800 Pa), and the minimum partial pressure of the inert gas (nitrogen) was between about 388 Torr (about 51,729 Pa) to about 679 Torr (about 90,526 Pa). A back contact was subsequently applied to the samples.

CdTe:Sb Samples

Sets of antimony-doped samples were prepared by deposition of a 1-5 μm layer of cadmium telluride (CdTe) with an antimony dopant on a window layer of a partly formed device to form a set of photovoltaic stacks. The photovoltaic stacks were then subjected to an activation treatment of $CdCl_2$ heat treatment performed in a reducing environment having about 100% forming gas, at a pressure of about 400 Torr (about 53,329 Pa) to about 600 Torr (about 79,993 Pa), and at a temperature of about 400° C. to about 500° C.

CdTe:P Samples

Sets of phosphorus-doped samples were prepared by deposition of a 1-5 μm layer of cadmium telluride (CdTe) with a phosphorus dopant on a window stack to form a set of photovoltaic stacks. The photovoltaic stacks were then subjected to an activation treatment of $CdCl_2$ heat treatment performed in a reducing environment having about 100% forming gas, at a pressure of about 400 Torr (about 53,329 Pa) to about 600 Torr (about 79,993 Pa), and at a temperature of about 400° C. to about 500° C.

Results

As shown in the figures and measured by experimental results, the vacuum anneal pre-treatment promoted stoichiometric rebalancing of Cd and Te, defect amelioration, and incorporation of the As dopant substantially homogenously through the bulk of the absorber layer. The heat treatment with $CdCl_2$ and $H_2$ promoted defect passivation, an increase in carrier concentration, a decrease in depletion width, and activation of the dopant by incorporation of the dopant into $V_{Te}$ of the crystal lattice. Through the treatment steps of the process, the dopant was activated and device efficiency was improved.

Figure 5:
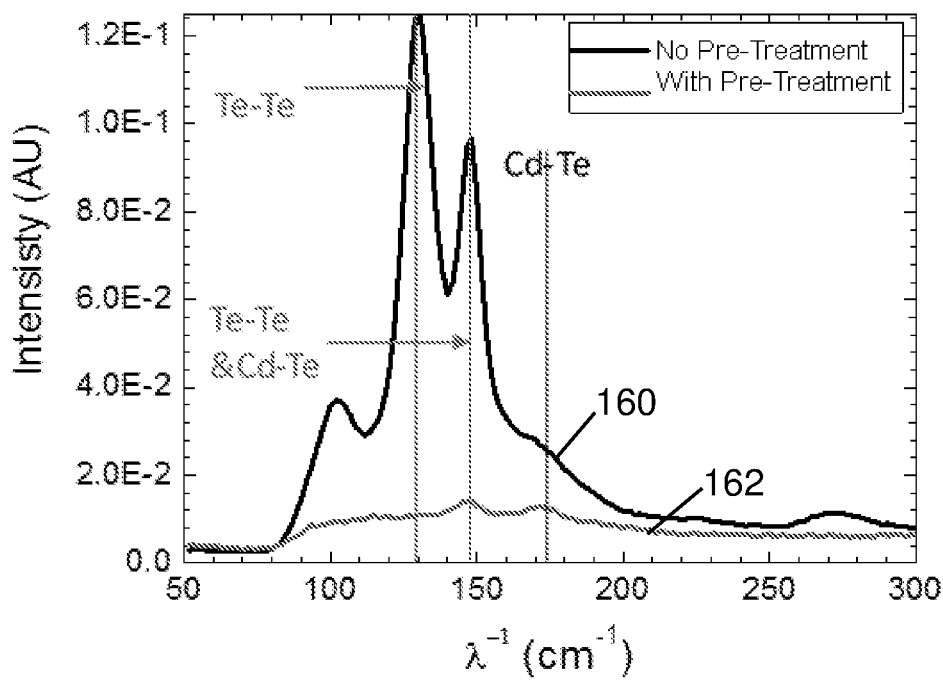
FIG. 5 shows RAMAN spectra of absorber films with and without pre-treatment.

FIG. 5 shows RAMAN spectra of CdTe absorber films with the absorber and arsenic dopant co-deposited at a temperature in a range of about 200° C. to about 250° C. FIG. 5 compares the control film corresponding to curve 160 to an equivalent film corresponding to curve 162. The control film and the equivalent film were subjected to a post-deposition vacuum heat pre-treatment for a period in a range of about 20 minutes to about 60 minutes at a temperature in a range of about 300° C. to about 420° C. The control film shows very strong Te phase present in the film indicating a Te-rich layer. Vacuum annealing at about 300° C. to about 420° C. for about 20 minutes to about 60 minutes promotes stoichiometric rebalancing and eliminates the Te peak. Similar results were found in films doped during the deposition step using either $AsH_3$ or $Cd_3As_2$.

Arsenic-doped CdTe devices, prepared using a deposition temperature of about 200° C. to about 250° C., with and without pre-treatment were compared to assess dopant concentration and distribution though the bulk of the absorber layer. The control exhibited a spike of the As dopant at the front interface of the absorber layer, at or adjacent the TCO, and concentration of the dopant was decreased and concentration averaged an order of magnitude lower than the spike through the bulk of the absorber. The stack subjected to the post-deposition vacuum anneal pre-treatment had a more uniform and consistent dopant distribution through the absorber bulk, with a narrower dopant concentration range and a higher median concentration level.

Figure 6:
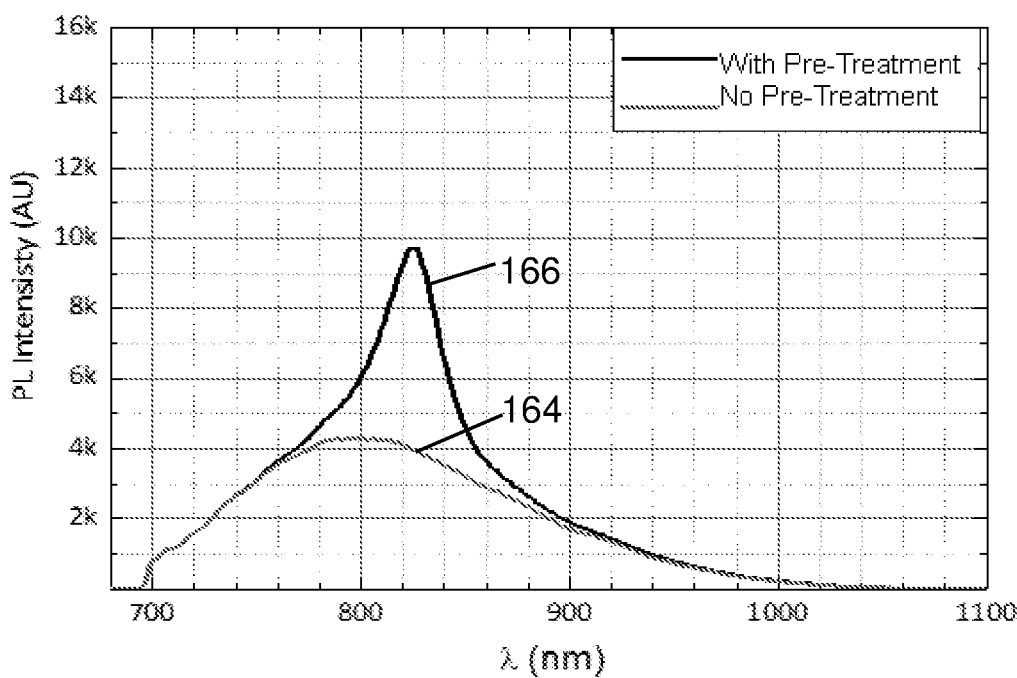
FIG. 6 shows plots of normalized photoluminescence (PL) intensity values for absorber films with and without pre-treatment.

FIG. 6 shows a plot of normalized photoluminescence (PL) intensity values comparing the PL wavelength distribution and intensity, comparing untreated, corresponding to curve 164, and treated, corresponding to curve 166, arsenic-doped CdTe devices subjected to annealing at about 300° C. to about 420° C. for about 20 minutes to about 60 minutes in vacuum. The higher intensity value and peaked shape of the PL curve indicate that the treated device had fewer defects than the control.

Figure 7:
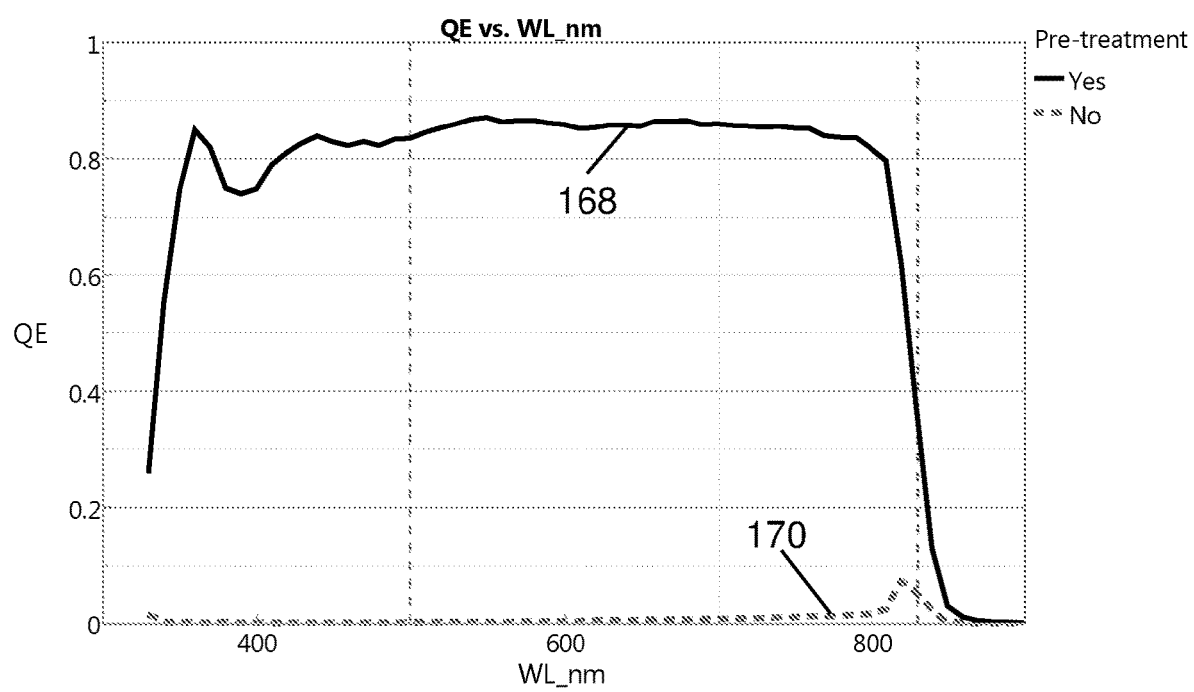
FIG. 7 shows normalized quantum efficiency (QE) by wavelength for absorber films with and without pre-treatment.

FIG. 7 shows normalized quantum efficiency (QE) by wavelength for arsenic-doped CdTe devices. The QE measurements compare devices subjected to a vacuum pre-treatment, corresponding to curve 168, as described above, with control, corresponding to curve 170. Both control and pre-treated devices were subjected to an equivalent activation treatment using $CdCl_2$ in a reducing environment, containing hydrogen and nitrogen gas, at a temperature in a range of about 400° C. to about 500° C. for a duration in a range of about 5 minutes to about 45 minutes. By comparing the QE measurements of the devices subjected to vacuum heat pre-treatment (curve 168), with control (curve 170), the measurements indicate that the pre-treatment improves overall QE of the treated devices. Exemplary devices prepared with vacuum pre-treatment followed by activation treatment had $V_{OC}$ measurements of about 740 mV.

Figure 8:
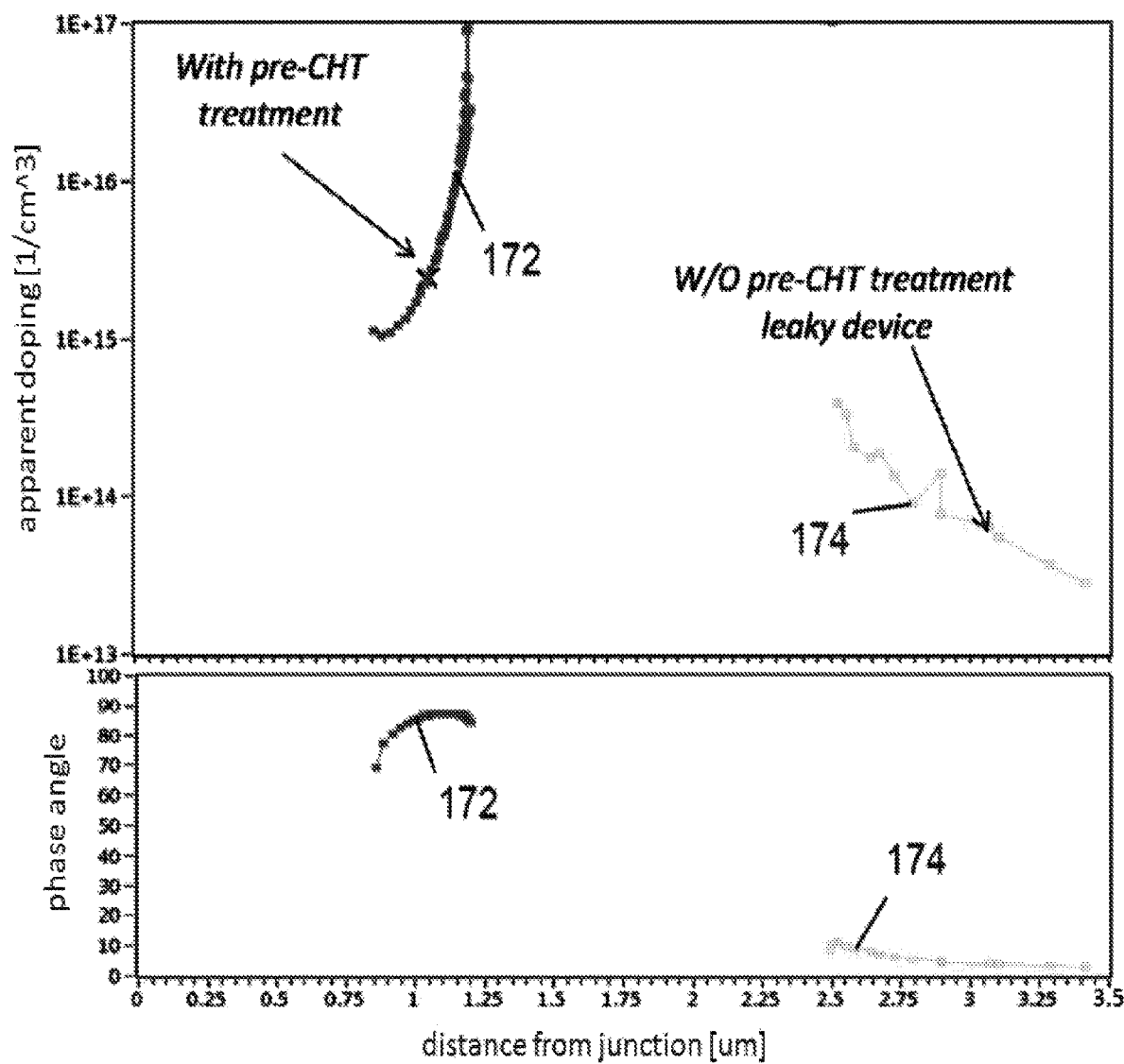
FIG. 8 shows capacitance-voltage (CV) measurements plotting charge carrier concentration in number of atoms per cubic cm (top), and phase angle (bottom), by depth for arsenic-doped CdTe absorbers after treatment, with and without pre-treatment.

FIG. 8 shows CV curves illustrating charge carrier concentration and phase angle by depth for arsenic-doped CdTe devices. Phase angle measures the phase difference between the voltage applied to the impedance and the current driven through it, and provides indication as to whether a device is "leaky," or prone to charge carrier recombination. Measurements are shown of arsenic-doped devices, with vacuum heat pre-treatment, which correspond to curves 172, and without vacuum heat pre-treatment, which correspond to curves 174. In comparing the measurements, the pre-treated device, curves 172, shows better performance characteristics as compared with the arsenic-doped control for which no pre-treatment was performed, curves 174. The treated device shows good charge carrier concentration with p-type doping averaging above $2 \times 10^{15}$ $cm^{-3}$, low depletion width and low leakage. The chart shows that the devices not treated by vacuum annealing were measured to have low phase angle, indicating that the devices were leaky and prone to high recombination rates.

The results indicate that an arsenic-doped absorber layer, deposited by thermal evaporation at a temperature in a range of about 200° C. to about 250° C., with pre-treatment vacuum annealing (pre-VCHT VA) and an activation treatment in a reducing environment, produces devices with fewer defects, less recombination, and a longer lifetime for mobile charge carriers. As measured, the vacuum heat treatment of the doped devices generally increased efficiency, increased $V_{OC}$, increased short-circuit current density, improved fill-factor, reduced resistance, reduced shunting, and improved performance.

Figure 9:
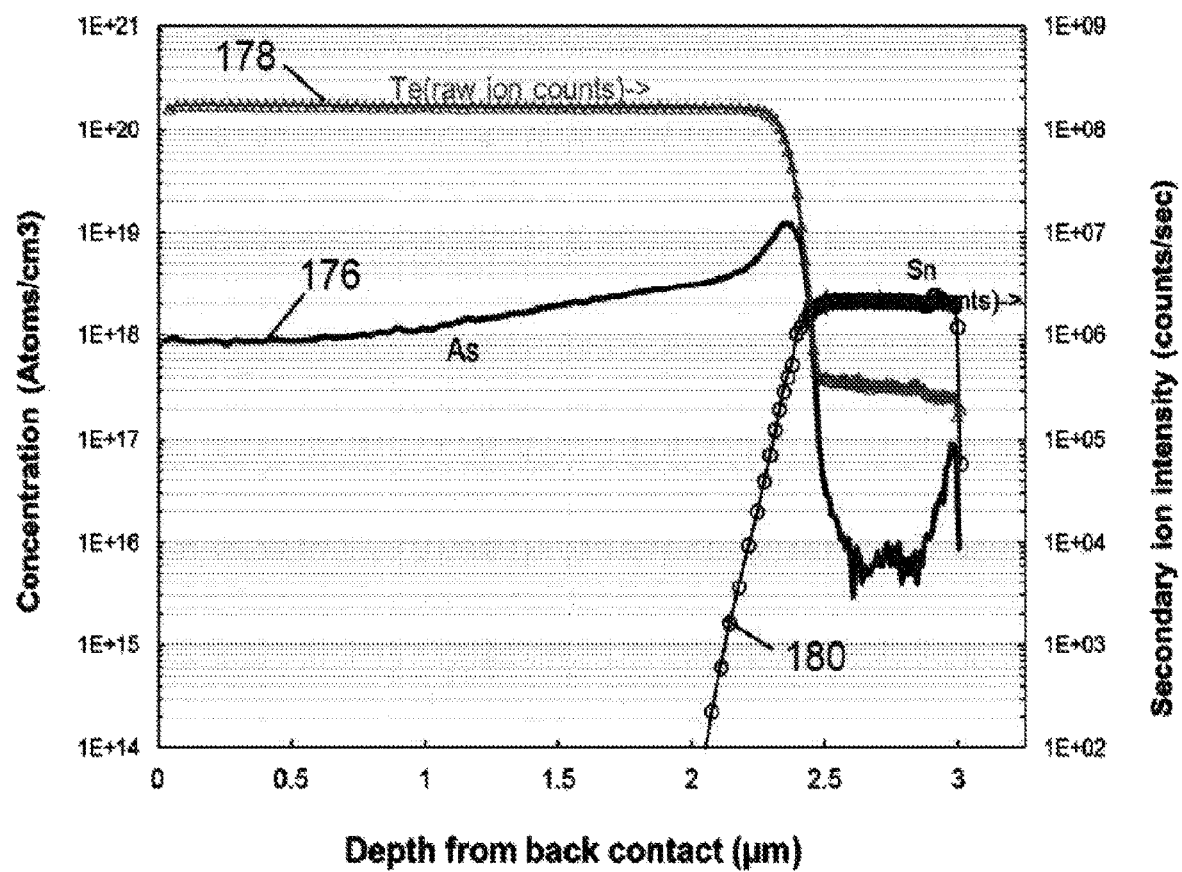
FIG. 9 shows concentration depth profiles of elements measured by DSIMS for an arsenic-doped absorber film after treatment.

FIG. 9 shows concentration depth profiles of elements for an example of an arsenic-doped, CdTe-alloy after a $CdCl_2$ activation treatment in a reducing environment. The depth profiles for As 176, Te (raw ion counts) 178, and Sn 180 were measured by dynamic secondary ion mass spectrometry (DSIMS). The absorber layer is shown extending from the zero-depth point, at the left side of the graph, through a depth of about 2 µm. Following $CdCl_2$ heat treatment, the device shows good dopant distribution through the absorber bulk and a high dopant concentration level.

Figure 10:
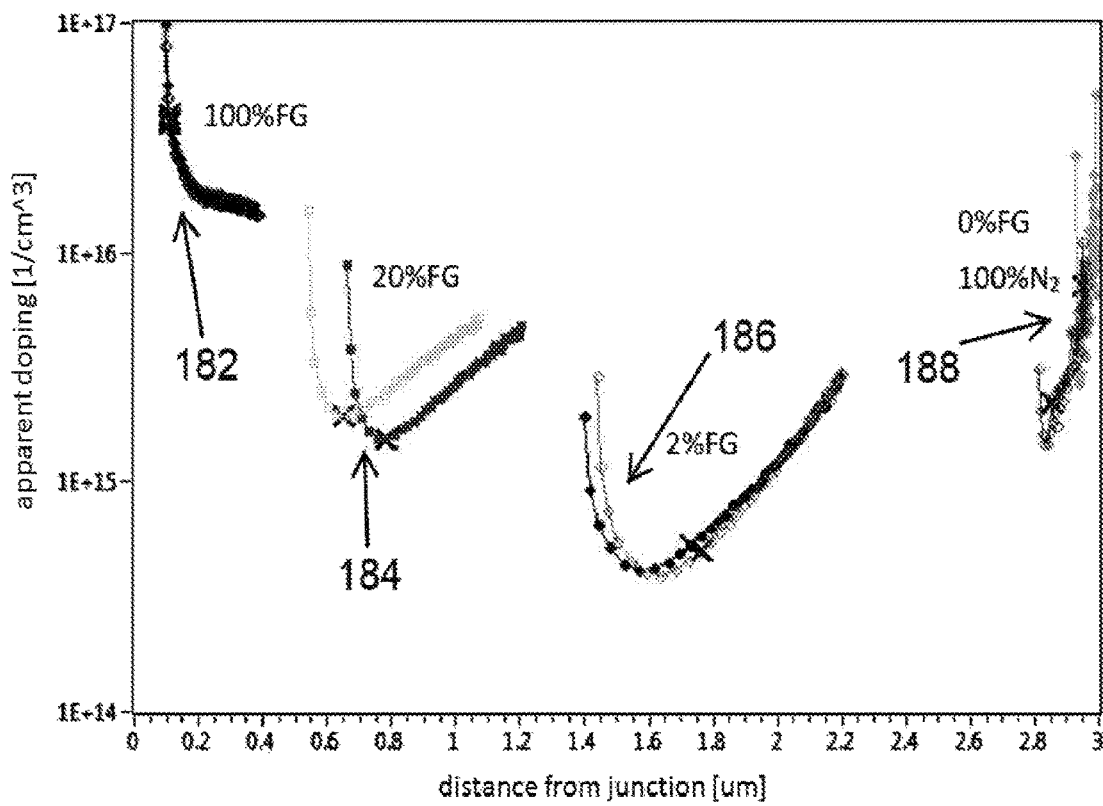
FIG. 10 shows CV measurements of charge carrier concentration by depth, comparing devices treated with hydrogen gas at selected concentration levels.

FIG. 10 shows CV curves of charge carrier concentration by depth for arsenic-doped samples subjected to vacuum anneal pre-treatment, as previously described, followed by treatment with $CdCl_2$ and heat in selected reducing environments. The selected reducing environments included 100% forming gas (curves 182), 20% forming gas (curves 184), 2% forming gas (curves 186), and 0% forming gas (curves 188) as a control. Nitrogen gas ($N_2$) made up the remaining portion of the environment. The total pressure was about 500 Torr. Thus, for example, the environment supplied with 100% forming gas consisted essentially of a mixture of hydrogen and nitrogen gas with an atomic fraction of about 3% Hydrogen (partial pressure of about 15 Torr (about 2,000 Pa)) and about 97% Nitrogen (partial pressure of about 485 Torr (about 64,661 Pa)); the environment supplied with 20% forming gas consisted essentially of a mixture of hydrogen and nitrogen gas with an atomic fraction of about 0.6% Hydrogen (partial pressure of about 3 Torr (about 400 Pa)) and about 99.4% Nitrogen (partial pressure of about 497 Torr (about 66,261 Pa)); the environment supplied with 2% forming gas consisted essentially of a mixture of hydrogen and nitrogen gas with an atomic fraction of about 0.06% Hydrogen (partial pressure of about 0.3 Torr (about 40 Pa)) and about 99.94% Nitrogen (partial pressure of about 499.7 Torr (about 66,621 Pa)); and the control environment supplied with 0% forming gas consisted essentially of Nitrogen. The curves 182 at a distance from the junction of about 0.1-0.4 µm corresponds to the 100% forming gas treatment. The curves 184 at a distance from the junction of about 0.5-1.2 µm corresponds to the 20% forming gas treatment. The curves 186 at a distance from the junction of about 1.4-2.2 µm corresponds to the 2% forming gas treatment. The curves 188 at a distance from the junction of about 2.8-3.0 µm corresponds to the control with 0% forming gas. As shown, with increasing $H_2$ concentration in the treatment step, carrier concentration increases and depletion width decreases. The control is substantially depleted.

Figure 11:
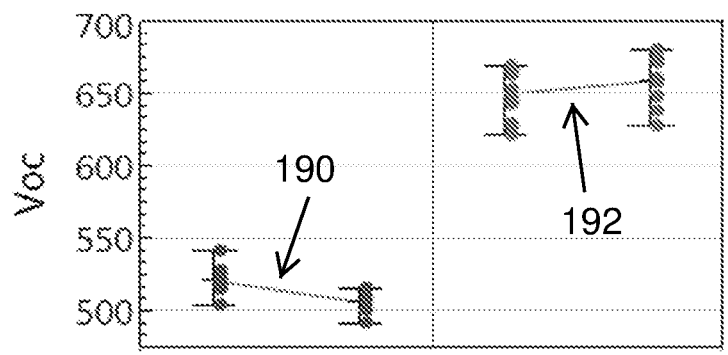
FIG. 11 shows $V_{OC}$ measurements of control (left) and treated (right) devices.

FIG. 11 shows comparative $V_{OC}$ measurements of arsenic-doped devices after $CdCl_2$ heat treatment. The data points 190 show the $V_{OC}$ measurements of the device treated in nitrogen; the data points 192 show the higher $V_{OC}$ measurements of the device treated in a reducing environment of about 100% forming gas. The samples treated with $CdCl_2$ heat treatment in a reducing environment favorably exhibit higher $V_{OC}$ compared to the equivalent samples without use of a forming gas environment.

Figure 12:
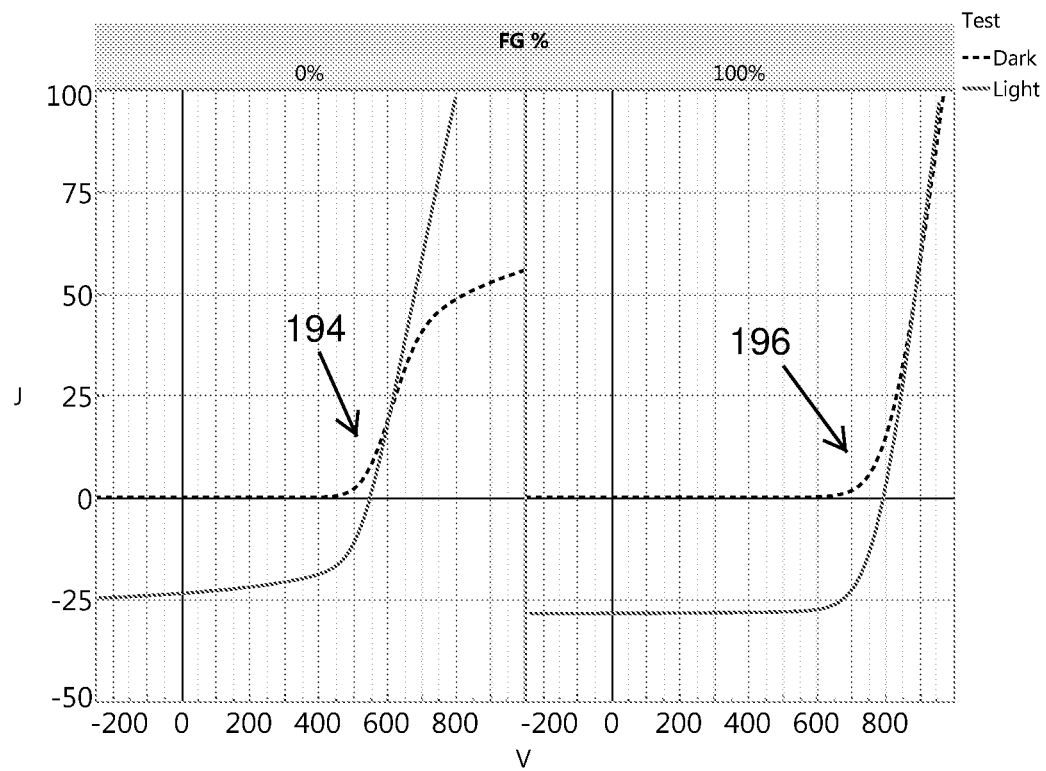
FIG. 12 shows current voltage (I-V) curves for control (left) and treated (right) devices.

FIG. 12 shows current voltage (I-V) curves for control (curves 194) and treated (curves 196) arsenic-doped devices. For this sample, the treated device was activated, as described above, in a selected reducing environment having about 100% forming gas.

Figure 13A:
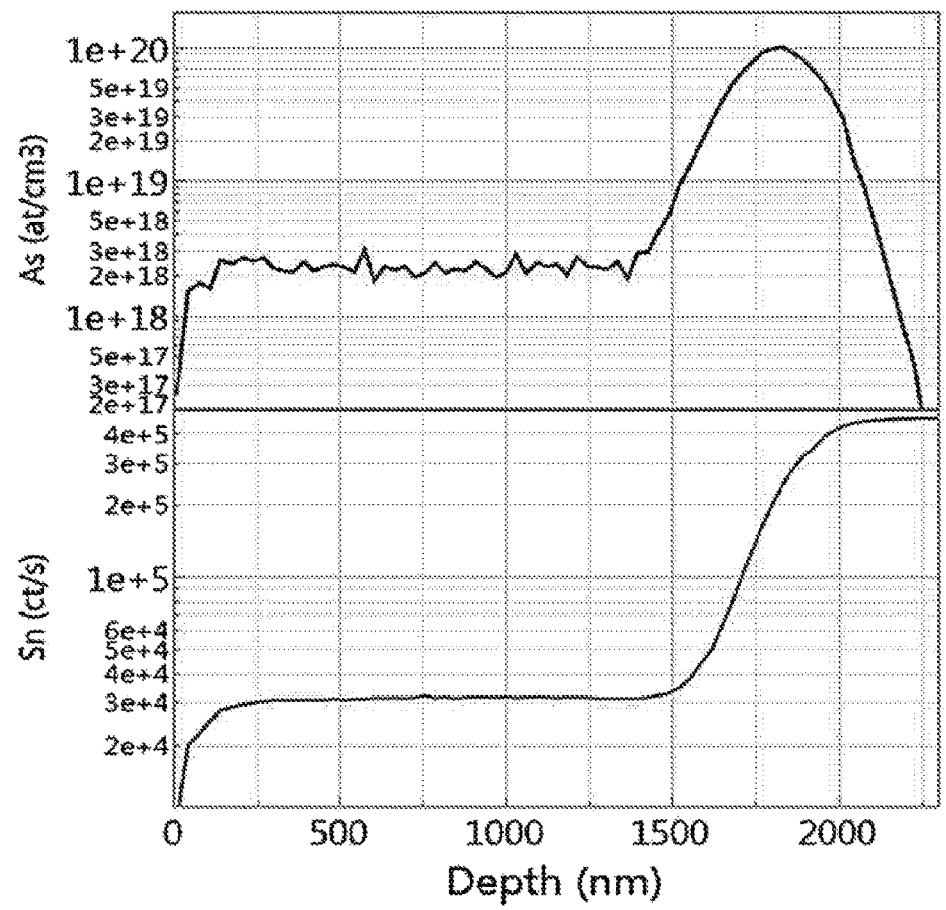
FIGS. 13A-C show measurements of an arsenic-doped device, treated according to an embodiment of the method.
Figure 13B:
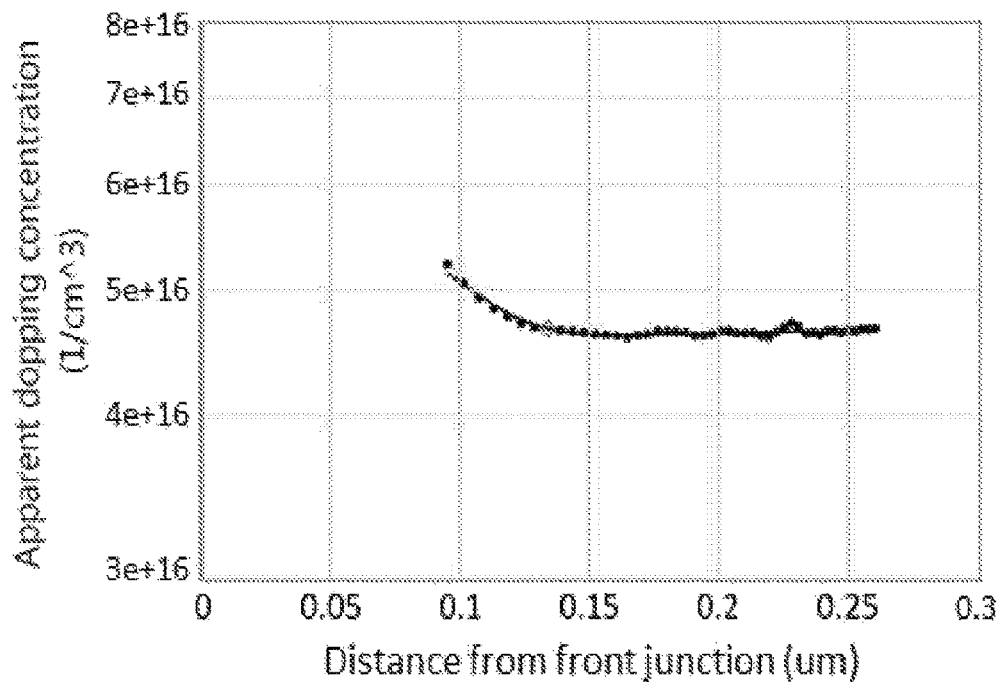
Figure 13C:
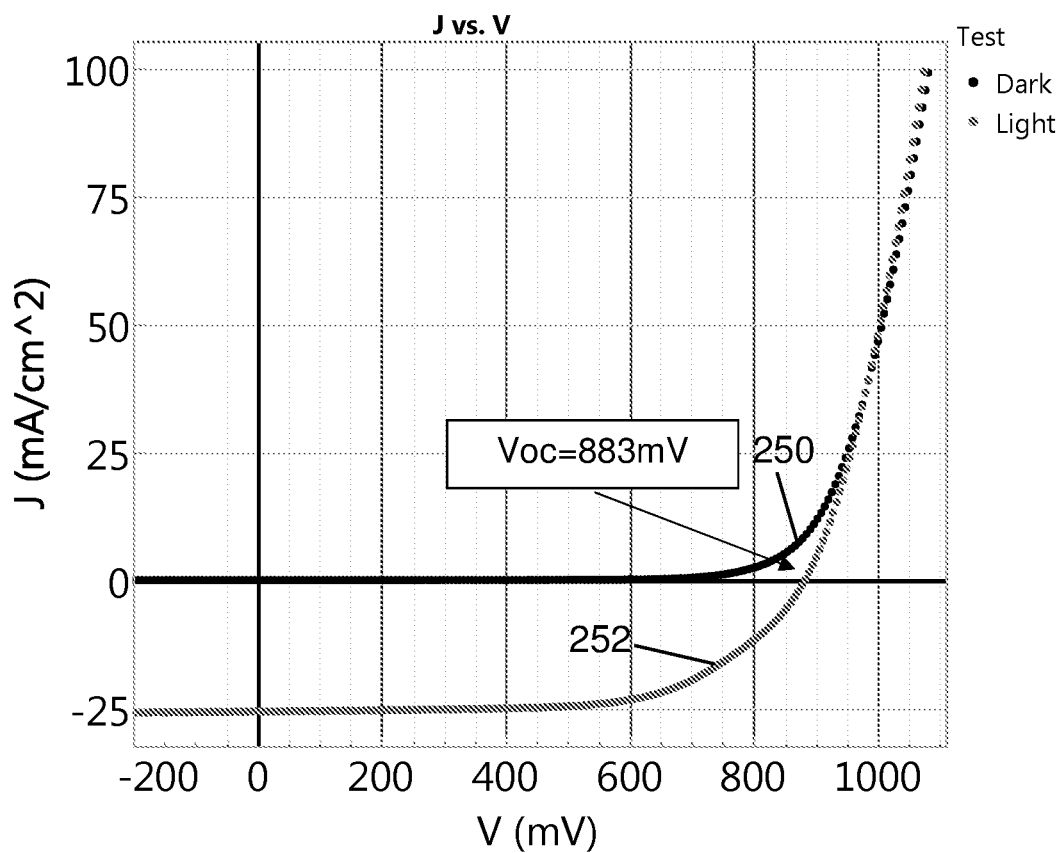

FIGS. 13A-C show measurements of a treated arsenic-doped device. FIG. 13A shows a DSIMS profile of arsenic dopant in the treated device. FIG. 13B shows CV measurements of charge carrier concentration. FIG. 13C shows I-V curves (dark curve 250 and light curve 252) for an arsenic-doped device with a measured $V_{OC}$ of 883 mV.

The p-type or n-type character of the semiconductor can be determined by measuring both CV and QE. Once the p-type character is established, the DSIMS data, showing concentration levels, may be used to determine p-type charge carrier concentration. For a single device, the ratio between CV apparent doping and DSIMS concentration shows the percent of dopant activated. For example, FIG. 13A shows a DSMS concentration of about $2 \times 10^{18}/cm^3$ and FIG. 13B shows p-type doping carrier concentration of about $4.5 \times 10^{16}/cm^3$, thus showing an activation of about 2%. The device shows high doping levels, a good depth profile, chemical incorporation of the dopant, and a high $V_{OC}$.

Figure 14A:
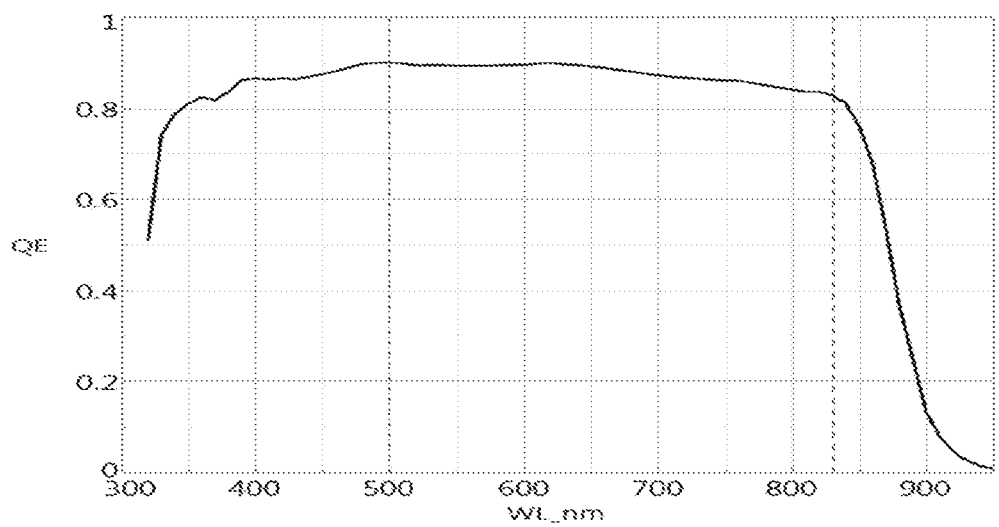
FIGS. 14A-C show measurements of an arsenic-doped device, treated according to an embodiment of the method.
Figure 14B:
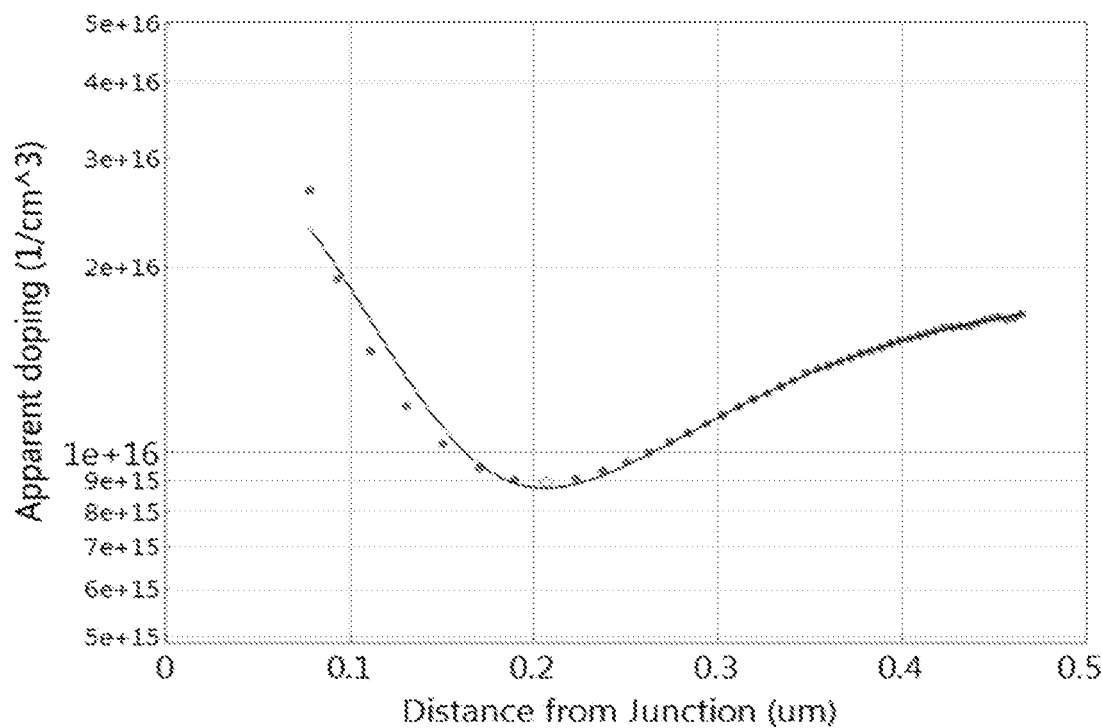
Figure 14C:
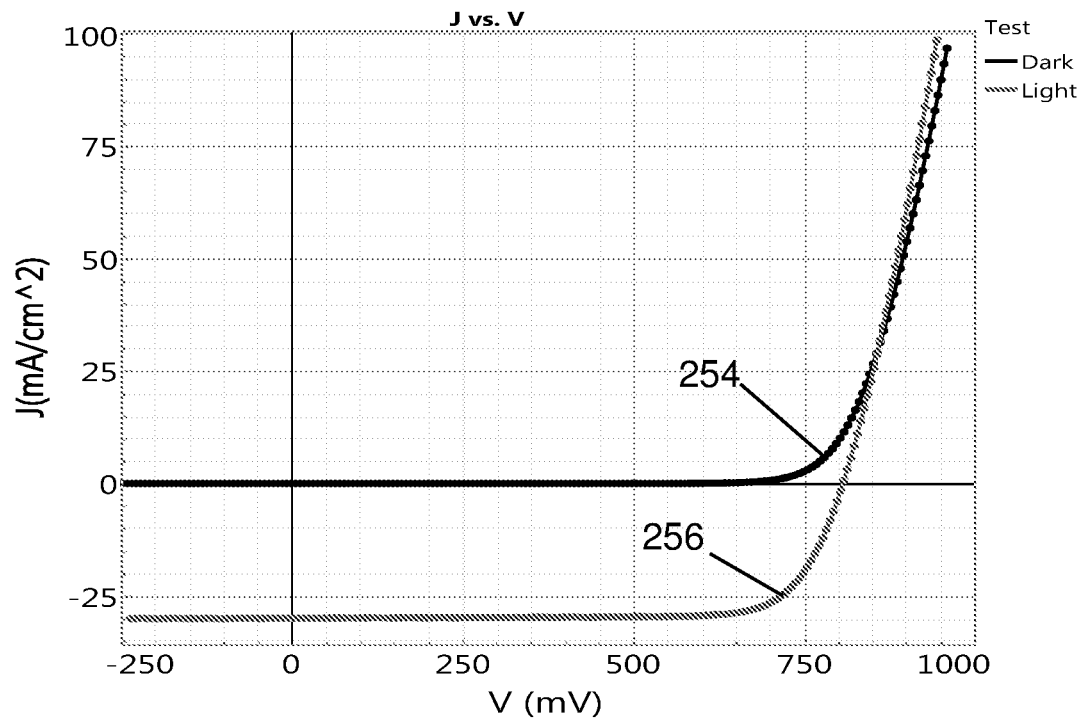

FIGS. 14A-C show measurements of a treated arsenic-doped device. FIG. 14A shows QE measurements. FIG. 14B shows I-V curves (dark curve 250 and light curve 252) for a device with a measured $V_{OC}$ of 806 mV and a FF of 78.3%. FIG. 14C shows CV measurements of charge carrier concentration. The treatment with forming gas was observed to improve quantum efficiency in the shorter wavelengths of about 400 nm to about 600 nm by about 15% to about 25%.

Arsenic has a low sticking coefficient, as compared to many other dopants; this can result in low incorporation of dopant into the bulk of the absorber layer, thus increasing the importance of activation. Embodiments of devices produced using described methods include dopant levels of one part per million in the absorber layer. In some embodiments, a 1% mole fraction of arsenic blended with a CdTe source powder produces about 0.01% atomic fraction, or $1.5 \times 10^{18}$ per cubic centimeter, in the bulk of the absorber. In some embodiments, the doped semiconductor absorber layer has a p-type charge carrier concentration in a range of about $1 \times 10^{15}$ $cm^{-3}$ to $8 \times 10^{16}$ $cm^{-3}$. In some embodiments, the doped semiconductor absorber layer has a p-type charge carrier concentration in a range of about $1 \times 10^{16}$ $cm^{-3}$ to $6 \times 10^{16}$ $cm^{-3}$.

Experiments were performed varying concentrations of arsenic dopant. Using the methods described, embodiments having a low concentration of arsenic of about 0.01 at. % reliably produced about $2.4 \times 10^{16}$ $cm^{-3}$ hole concentration. As shown in the example results in Table 1, activation levels of about 3% to about 5% can be produced over a range of doping levels.

TABLE 1

| Powder [As] (%) | Bulk[As] before CHT | Bulk[As] after CHT | [p] (CV, count/cm3) | Activation (bulk) |
|---|---|---|---|---|
| 0.01 | 1.00E+16 | 5.6E+17 | 2.4E+16 | 4.3% |
| 0.1 | 2.00E+16 | 8.5E+17 | 3.2E+16 | 3.8% |
| 1 | 6.00E+17 | 1.86E+18 | 5.5E+16 | 3.0% |

Figure 15:
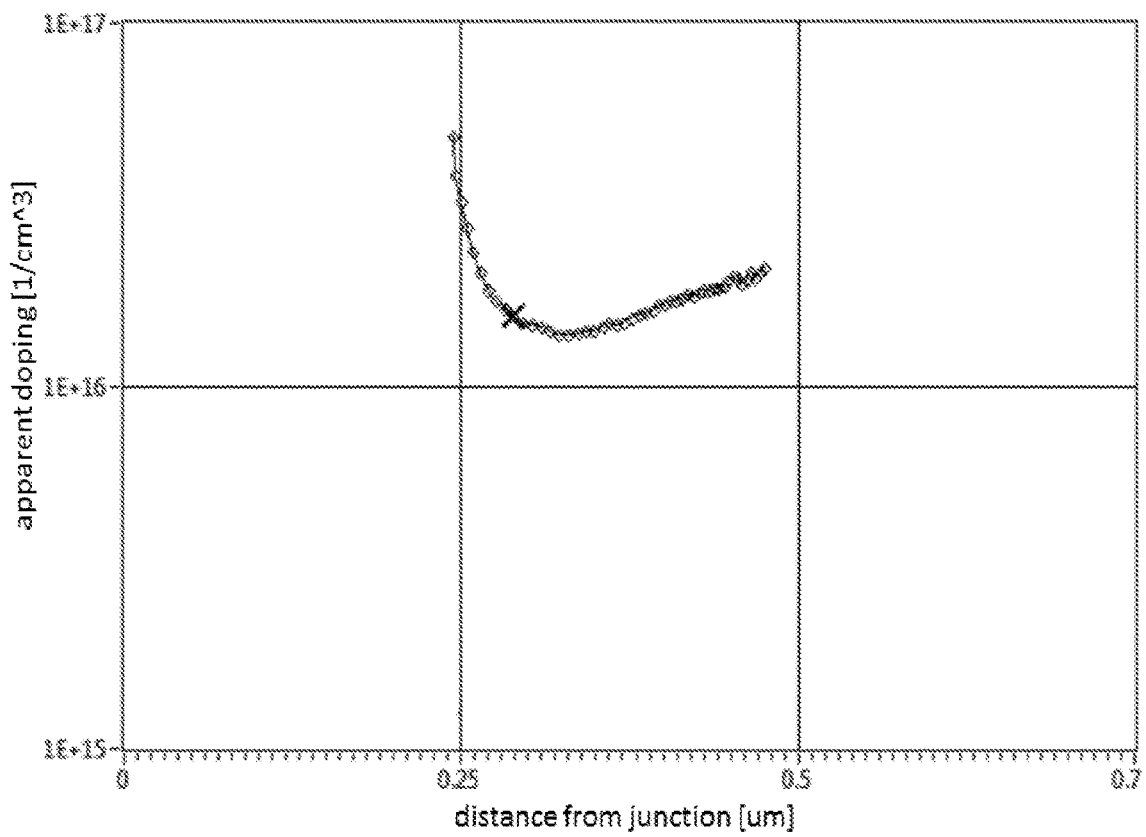
FIG. 15 shows capacitance-voltage measurements plotting charge carrier concentration by depth for antimony-doped CdTe absorbers after treatment.

FIG. 15 shows capacitance-voltage measurements plotting charge carrier concentration by depth for antimony-doped samples after activation treatment of $CdCl_2$ heat treatment performed in a 100% forming gas environment.

Figure 16:
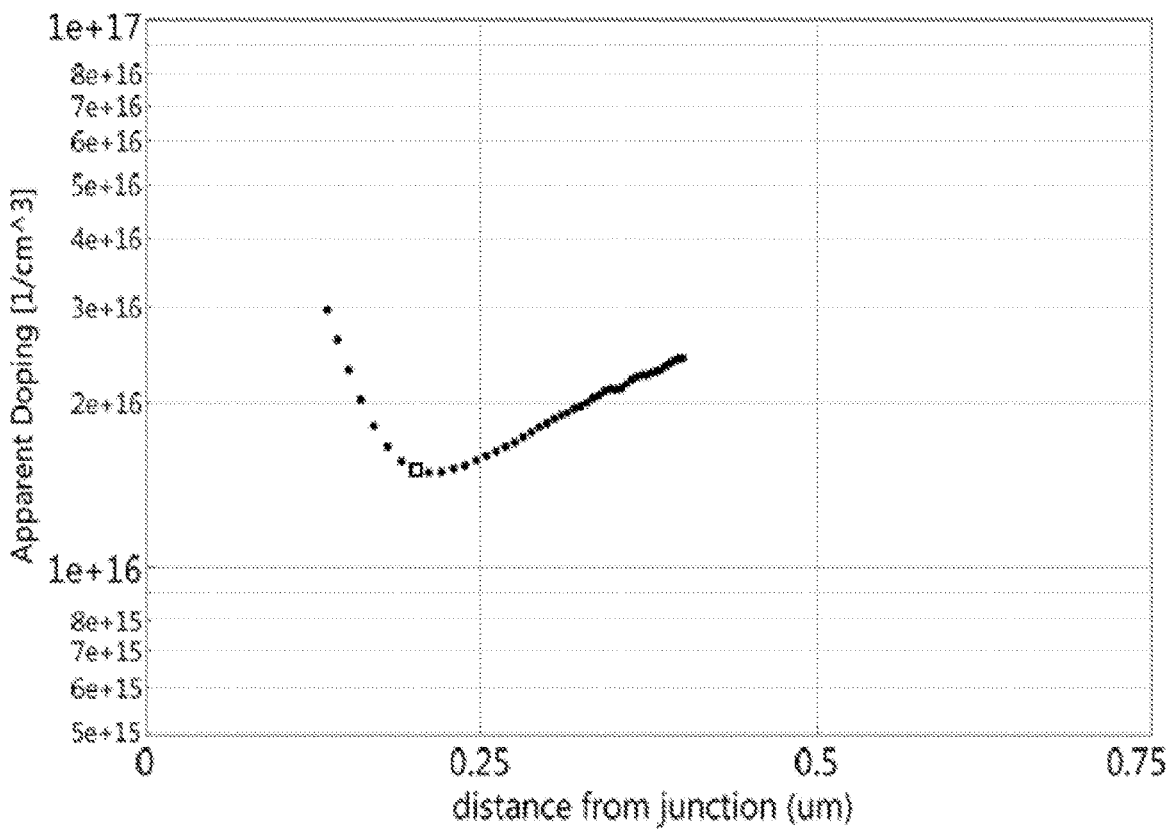
FIG. 16 shows capacitance-voltage measurements plotting charge carrier concentration by depth for phosphorus-doped CdTe absorbers after treatment.

FIG. 16 shows capacitance-voltage measurements plotting charge carrier concentration by depth for phosphorus-doped CdTe absorbers after activation treatment of $CdCl_2$ heat treatment performed in a reducing environment having about 100% forming gas, at a pressure of about 400 Torr (about 53,329 Pa) to about 600 Torr (about 79,993 Pa), and at a temperature of about 400° C. to about 500° C.

Additional sets of exemplary devices were prepared, varying the dopant composition and level, incorporating additional semiconductor compounds into the stack, and varying the deposition conditions, pre-treatment parameters, and treatment parameters. The data collected are consistent with the results drawn from the examples provided.

As shown in the examples and comparative control samples, using a conventional post-deposition passivation in air or $N_2$, polycrystalline CdTe absorber films with group V doping incorporation cannot be activated.

Provided are methods for activating a group V dopant in a polycrystalline II-VI semiconductor absorber layer. Steps of an exemplary method include providing an absorber film doped with a group V dopant; optionally applying a first heat treatment to the absorber film in a first heat-treating environment, wherein the first heat-treating environment comprises a substantially oxygen-free atmosphere and may be at low-pressure or vacuum; contacting a surface or a portion of the absorber film with a halogen or passivating agent; and applying a second heat treatment to the absorber film in a second heat-treating environment; supplying a reducing agent, such as hydrogen gas to the second heat-treating environment to form a reducing environment; thereby activating the dopant in the absorber film, whereby the activated dopant occupies VI-type vacancies in a II-VI semiconductor crystal lattice.

Disclosed methods have been shown, as described herein, to activate group V dopants in polycrystalline absorber layers of cadmium telluride, and alloys of cadmium telluride having materials including selenium and zinc. The methods improve lifetime and device performance. Suitable methods include a post-deposition annealing process. A pre-treatment step, of annealing under vacuum or in a substantially oxygen-free environment, achieves stoichiometry tuning, dopant distribution, and defect reduction. Treatment of the semiconductor stack with cadmium chloride or another passivating agent and heating the stack while supplying a reducing gas, achieves dopant activation, grain growth, and defect passivation.

In some embodiments, methods, apparatuses and/or structures provide for the following: forming a Cd-rich absorber layer; incorporation of dopants into a polycrystalline semiconductor lattice at chalcogenide vacancies; forming Te vacancies; activating group V dopants to increase charge carrier mobility and density; repairing defects of the crystalline grain structure; reducing shunting; reducing carrier recombination; optional compositional grading of semiconductor layers to optimize the structure and reduce interface recombination; the production of heavily doped material grown over a superstrate or substrate and processed, in situ, to create one or more doped absorber layers; reduced recombination of electrons and holes, and providing cost effective photovoltaic structures. In embodiments, the capabilities described allow for control over light absorption and charge carrier flow in the device for optimized performance. Methods and structures of the present disclosure can provide photovoltaic devices with improved short circuit current (Jsc), open circuit voltage (Voc), and fill factor (FF) in relation to prior art thin film photovoltaic devices.

According to the embodiments provided herein, method for treating a photovoltaic semiconductor absorber layer can include supplying a reducing agent to produce a reducing environment. The method can include contacting at least a portion of an absorber layer with a passivating agent while the absorber layer is the reducing environment. The absorber layer can be doped with a group V dopant. The absorber layer can include cadmium and tellurium. The method can include heating the absorber layer while in the reducing environment at a selected temperature and a selected pressure for a selected treatment duration.

According to the embodiments provided herein, photovoltaic device can include an absorber layer. The absorber layer can include cadmium, selenium, and tellurium, and a group V dopant. A concentration of the group V dopant in the absorber layer can be between about $1\times10^{16}$ $cm^{-3}$ to about $5\times10^{20}$ $cm^{-3}$ throughout the thickness of the absorber layer. 1 at. % to 10 at. % of the group V dopant can be activated. A portion of the group V dopant that is activated can occupy Te vacancies in a CdTe crystal lattice.

The principles and modes of operation of embodiments of the present disclosure have been explained and illustrated with examples. However, the embodiments described herein may be practiced otherwise than as specifically explained and illustrated without departing from the scope of the disclosure. While exemplary embodiments are presented, it should be appreciated that a vast number of variations exist. It should also be appreciated that the exemplary embodiment or exemplary embodiments are only examples, and are not intended to limit the scope, applicability, or configuration of the disclosure in any way. Rather, the detailed description provides those skilled in the art with a road map for implementing exemplary embodiments of the disclosure. It is to be understood that various changes may be made in the function and arrangement of elements described in an exemplary embodiment without departing from the scope of the present disclosure as set forth in the appended claims.

What is claimed is:

1. A method for treating a photovoltaic semiconductor absorber layer comprising:
   supplying a reducing agent to produce a reducing environment;
   contacting at least a portion of an absorber layer with a passivating agent while the absorber layer is in the reducing environment, wherein the absorber layer is doped with a group V dopant, and wherein the absorber layer comprises cadmium and tellurium; and
   annealing the absorber layer with the passivating agent while in the reducing environment at a selected temperature and a selected pressure for a selected treatment duration, wherein the reducing environment comprises at least a trace amount of oxygen and a ratio of the partial pressure of the reducing agent to a partial pressure of the oxygen is at least 3.

2. The method of claim 1, wherein the partial pressure of the oxygen in the reducing environment is less than 1 Torr.

3. The method of claim 1, wherein a majority of the reducing environment is formed with an inert gas.

4. The method of claim 3, wherein the reducing environment consists essentially of a mixture of hydrogen and nitrogen gas.

5. The method of claim 1, wherein the passivating agent comprises $CdCl_2$.

6. The method of claim 1, wherein the absorber layer comprises selenium.

7. The method of claim 1, wherein the group V dopant comprises arsenic.

8. The method of claim 1, wherein the selected temperature is in a range of 350° C. to 500° C., the selected pressure is in a range of 200 Torr to 800 Torr, and the selected treatment duration is in a range of 5 minutes to 45 minutes.

9. The method of claim 1, wherein the absorber layer comprises a concentration of the group V dopant between $1\times10^{16}$ cm$^{-3}$ and $5\times10^{20}$ cm$^{-3}$ throughout a thickness of the absorber layer, and wherein annealing the absorber layer in the reducing environment activates between 1 at. % to 10 at. % of the group V dopant.

10. The method of claim 1, wherein the passivating agent comprises one or more of: $MnCl_2$, $MgCl_2$, $NH_4Cl$, $ZnCl_2$, and $TeCl_4$.

11. The method of claim 1, wherein the group V dopant is selected from: bismuth, antimony, arsenic, phosphorus, nitrogen, and combinations thereof.

12. The method of claim 1, wherein the reducing environment comprises 99.4% nitrogen.

13. The method of claim 1, wherein the reducing agent comprises $H_2$, hydrogen sulfide, methane, carbon monoxide, an ammonia compound, or a combination thereof.

14. The method of claim 13, wherein the reducing agent comprises $H_2$.

* * * * *